United States Patent
Bauser et al.

(10) Patent No.: US 8,199,595 B2
(45) Date of Patent: Jun. 12, 2012

(54) TECHNIQUES FOR SENSING A SEMICONDUCTOR MEMORY DEVICE

(75) Inventors: Philippe Bruno Bauser, Divonne-les-Bains (FR); Jean-Michel Daga, Rousset (FR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/877,044

(22) Filed: Sep. 7, 2010

(65) Prior Publication Data

US 2011/0058436 A1 Mar. 10, 2011

Related U.S. Application Data

(60) Provisional application No. 61/239,999, filed on Sep. 4, 2009.

(51) Int. Cl.
*G11C 7/02* (2006.01)
(52) U.S. Cl. ........ 365/207; 365/154; 365/205; 365/196; 365/226; 365/203
(58) Field of Classification Search .................. 365/207, 365/154, 205, 196, 226, 203
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |

(Continued)

FOREIGN PATENT DOCUMENTS

CA 272437 7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Thong Q Le
(74) *Attorney, Agent, or Firm* — Wilmer Cutler Pickering Hale and Dorr LLP

(57) ABSTRACT

Techniques for sensing a semiconductor memory device are disclosed. In one particular exemplary embodiment, the techniques may be realized as an apparatus including a memory cell array comprising a plurality of memory cells. The apparatus may also include a first data sense amplifier circuitry including an amplifier transistor having a first region coupled to at least one of the plurality of memory cells via a bit line. The apparatus may further include a data sense amplifier latch circuitry including a first input node coupled to the data sense amplifier circuitry via a second region of the amplifier transistor.

20 Claims, 11 Drawing Sheets

U.S. PATENT DOCUMENTS

| | | | |
|---|---|---|---|
| 5,313,432 A | 5/1994 | Lin et al. | |
| 5,315,541 A | 5/1994 | Harari et al. | |
| 5,350,938 A | 9/1994 | Matsukawa | |
| 5,355,330 A | 10/1994 | Hisamoto et al. | |
| 5,388,068 A | 2/1995 | Ghoshal et al. | |
| 5,397,726 A | 3/1995 | Bergemont et al. | |
| 5,432,730 A | 7/1995 | Shubat et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,506,436 A | 4/1996 | Hayashi et al. | |
| 5,515,383 A | 5/1996 | Katoozi | |
| 5,526,307 A | 6/1996 | Yiu et al. | |
| 5,528,062 A | 6/1996 | Hsieh et al. | |
| 5,568,356 A | 10/1996 | Schwartz | |
| 5,583,808 A | 12/1996 | Brahmbhatt | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,677,867 A | 10/1997 | Hazani | |
| 5,696,718 A | 12/1997 | Hartmann | |
| 5,740,099 A | 4/1998 | Tanigawa | |
| 5,754,469 A | 5/1998 | Hung et al. | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,798,968 A | 8/1998 | Lee et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 5,986,914 A | 11/1999 | McClure | |
| 6,018,172 A | 1/2000 | Hidada et al. | |
| 6,048,756 A | 4/2000 | Lee et al. | |
| 6,081,443 A | 6/2000 | Morishita | |
| 6,096,598 A | 8/2000 | Furukawa et al. | |
| 6,097,056 A | 8/2000 | Hsu et al. | |
| 6,097,624 A | 8/2000 | Chung et al. | |
| 6,111,778 A | 8/2000 | MacDonald et al. | |
| 6,121,077 A | 9/2000 | Hu et al. | |
| 6,133,597 A | 10/2000 | Li et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,698 B1 | 1/2001 | Gruening et al. | |
| 6,177,708 B1 | 1/2001 | Kuang et al. | |
| 6,214,694 B1 | 4/2001 | Leobandung et al. | |
| 6,222,217 B1 | 4/2001 | Kunikiyo | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,262,935 B1 | 7/2001 | Parris et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,333,866 B1 | 12/2001 | Ogata | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,432,769 B1 | 8/2002 | Fukuda et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,480,407 B1 | 11/2002 | Keeth | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,537,871 B2 | 3/2003 | Forbes | |
| 6,538,916 B2 | 3/2003 | Ohsawa | |
| 6,544,837 B1 | 4/2003 | Divakauni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,552,932 B1 | 4/2003 | Cernea | |
| 6,556,477 B2 | 4/2003 | Hsu et al. | |
| 6,560,142 B1 | 5/2003 | Ando | |
| 6,563,733 B2 | 5/2003 | Liu et al. | |
| 6,566,177 B1 | 5/2003 | Radens et al. | |
| 6,567,330 B2 | 5/2003 | Fujita et al. | |
| 6,573,566 B2 | 6/2003 | Ker et al. | |
| 6,574,135 B1 | 6/2003 | Komatsuzaki | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,653,175 B1 | 11/2003 | Nemati et al. | |
| 6,686,624 B2 | 2/2004 | Hsu | |
| 6,703,673 B2 | 3/2004 | Houston | |
| 6,707,118 B2 | 3/2004 | Muljono et al. | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,870,225 B2 | 3/2005 | Bryant et al. | |
| 6,882,566 B2 | 4/2005 | Nejad et al. | |
| 6,888,770 B2 | 5/2005 | Ikehashi | |
| 6,894,913 B2 | 5/2005 | Yamauchi | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portman et al. | |
| 6,913,964 B2 | 7/2005 | Hsu | |
| 6,936,508 B2 | 8/2005 | Visokay et al. | |
| 6,969,662 B2 | 11/2005 | Fazan et al. | |
| 6,975,536 B2 | 12/2005 | Maayan et al. | |
| 6,982,902 B2 | 1/2006 | Gogl et al. | |
| 6,987,041 B2 | 1/2006 | Ohkawa | |
| 7,030,436 B2 | 4/2006 | Forbes | |
| 7,037,790 B2 | 5/2006 | Chang et al. | |
| 7,041,538 B2 | 5/2006 | Ieong et al. | |
| 7,042,765 B2 | 5/2006 | Sibigtroth et al. | |
| 7,061,806 B2 | 6/2006 | Tang et al. | |
| 7,085,153 B2 | 8/2006 | Ferrant et al. | |
| 7,085,156 B2 | 8/2006 | Ferrant et al. | |
| 7,170,807 B2 | 1/2007 | Fazan et al. | |
| 7,177,175 B2 | 2/2007 | Fazan et al. | |
| 7,187,581 B2 | 3/2007 | Ferrant et al. | |
| 7,230,846 B2 | 6/2007 | Keshavarzi | |
| 7,233,024 B2 | 6/2007 | Scheuerlein et al. | |
| 7,256,459 B2 | 8/2007 | Shino | |
| 7,301,803 B2 | 11/2007 | Okhonin et al. | |
| 7,301,838 B2 | 11/2007 | Waller | |
| 7,317,641 B2 | 1/2008 | Scheuerlein | |
| 7,324,387 B1 | 1/2008 | Bergemont et al. | |
| 7,335,934 B2 | 2/2008 | Fazan | |
| 7,341,904 B2 | 3/2008 | Willer | |
| 7,416,943 B2 | 8/2008 | Figura et al. | |
| 7,456,439 B1 | 11/2008 | Horch | |

| | | |
|---|---|---|
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0062793 A1* | 3/2008 | Waller et al. .................. 365/205 |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |

| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006 IEDM '06, International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless It DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architecture of Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1t DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MESFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces, Responsible for Junction Leakage, ICSI, May 19, 2009.
Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.
Lu et al., A Novel Two- Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMO Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid -State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

\* cited by examiner

TECHNIQUES FOR SENSING A SEMICONDUCTOR MEMORY DEVICE

CROSS-REFERENCE TO RELATED APPLICATIONS

This patent application claims priority to U.S. Provisional Patent Application No. 61/239,999, filed Sep. 4, 2009, which is hereby incorporated by reference herein in its entirety.

FIELD OF THE DISCLOSURE

The present disclosure relates generally to semiconductor memory devices and, more particularly, to techniques for sensing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double, triple, or surrounding gate), and Fin-FET devices.

A semiconductor memory device may include a memory cell having a memory transistor with an electrically floating body region wherein electrical charges may be stored. When excess majority electrical charge carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars) on a silicon-on-insulator (SOI) or bulk substrates.

Various techniques may be employed to read data from and/or write data to a semiconductor memory device having an electrically floating body. In one conventional technique, the memory cell of the semiconductor memory device may be read by applying bias signals to a source/drain region(s) and/or a gate of the memory transistor. As such, a conventional reading technique may involve sensing an amount of current provided/generated by/in the electrically floating body region of the memory cell in response to the application of the source/drain region and/or gate bias signals to determine a data state stored in the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and/or the gate of the memory transistor. As such, a conventional writing technique may result in an increase/decrease of majority charge carriers in the electrically floating body region of the memory cell which, in turn, may determine the data state of the memory cell. An increase of majority charge carriers in the electrically floating body region may result from impact ionization, band-to-band tunneling (gate-induced drain leakage "GIDL"), or direct injection. A decrease of majority charge carriers in the electrically floating body region may result from charge carriers being removed via drain region charge carrier removal, source region charge carrier removal, or drain and source region charge carrier removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell in the semiconductor memory device, which, in turn, may result in an inaccurate determination of the state of the memory cell. Furthermore, in the event that a bias is applied to the gate of the memory transistor that is below a threshold voltage potential of the memory transistor, a channel of minority charge carriers beneath the gate may be eliminated. However, some of the minority charge carriers may remain "trapped" in interface defects. Some of the trapped minority charge carriers may recombine with majority charge carriers, which may be attracted to the gate as a result of the applied bias. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the state of the memory cell.

In view of the foregoing, it may be understood that there may be significant problems and shortcomings associated with conventional techniques for sensing semiconductor memory devices.

SUMMARY OF THE DISCLOSURE

Techniques for sensing a semiconductor memory device are disclosed. In one particular exemplary embodiment, the techniques may be realized as an apparatus comprising a memory cell array comprising a plurality of memory cells. The apparatus may also comprise a first data sense amplifier circuitry including an amplifier transistor having a first region coupled to at least one of the plurality of memory cells via a bit line. The apparatus may further comprise a data sense amplifier latch circuitry including a first input node coupled to the data sense amplifier circuitry via a second region of the amplifier transistor.

In accordance with other aspects of the particular exemplary embodiment, the apparatus may further comprise a first power source coupled to the first region of the amplifier transistor.

In accordance with further aspects of this particular exemplary embodiment, the apparatus may further comprise a second power source coupled to the second region of the amplifier transistor.

In accordance with additional aspects of this particular exemplary embodiment, the apparatus may further comprise a switch transistor coupled to the first region of amplifier transistor and the second region of the amplifier transistor.

In accordance with yet another aspect of this particular exemplary embodiment, the switch transistor may comprise a first region coupled to a first power source and a second region coupled to a second power source.

In accordance with other aspects of the particular exemplary embodiment, the data sense amplifier latch circuitry may comprise a second input node coupled to second data sense amplifier circuitry.

In accordance with further aspects of this particular exemplary embodiment, the data sense amplifier latch circuitry may further comprise a plurality of transistors arranged in a cross-coupled configuration that may be configured to amplify a voltage or current difference between the first input node and the second input node.

In accordance with additional aspects of this particular exemplary embodiment, the second data sense amplifier circuitry may provide a reference voltage potential to the second input node of the data sense amplifier latch circuitry.

In accordance with yet another aspect of this particular exemplary embodiment, the data sense amplifier latch circuitry may comprise a first latch access transistor at the first input node and a second latch access transistor at the second input node.

In accordance with other aspects of the particular exemplary embodiment, the data sense amplifier latch circuitry may comprise an equalization transistor arranged in series with the first latch access transistor and the second latch access transistor.

In accordance with further aspects of this particular exemplary embodiment, the apparatus may further comprise pre-charge circuitry coupled to the bit line.

In accordance with additional aspects of this particular exemplary embodiment, the pre-charge circuitry may comprises a first pre-charge transistor coupled to a control line.

In accordance with yet another aspect of this particular exemplary embodiment, the pre-charge circuitry may further comprise a second pre-charge transistor having a first region coupled to the bit line.

In accordance with other aspects of the particular exemplary embodiment, the second pre-charge transistor may comprise a second region coupled to the first pre-charge transistor.

In accordance with further aspects of this particular exemplary embodiment, the second pre-charge transistor may further comprise a third region coupled to the second region of the amplifier transistor.

In accordance with additional aspects of this particular exemplary embodiment, the apparatus may further comprise an input/output circuitry coupled to the data sense amplifier latch circuitry.

In accordance with yet another aspect of this particular exemplary embodiment, the input/output circuitry may comprise a first input/output transistor coupled to the first input node of the data sense amplifier latch circuitry.

In accordance with other aspects of the particular exemplary embodiment, the input/output circuitry may further comprise a second input/output transistor coupled to a second input node of the data sense amplifier latch circuitry.

In accordance with further aspects of this particular exemplary embodiment, the data sense amplifier latch circuitry may comprise a second input node coupled to the bit line.

In accordance with additional aspects of this particular exemplary embodiment, a voltage potential at the first input node of the data sense amplifier latch circuitry may be inversely related to a voltage potential at the second input node of the data sense amplifier latch circuitry.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
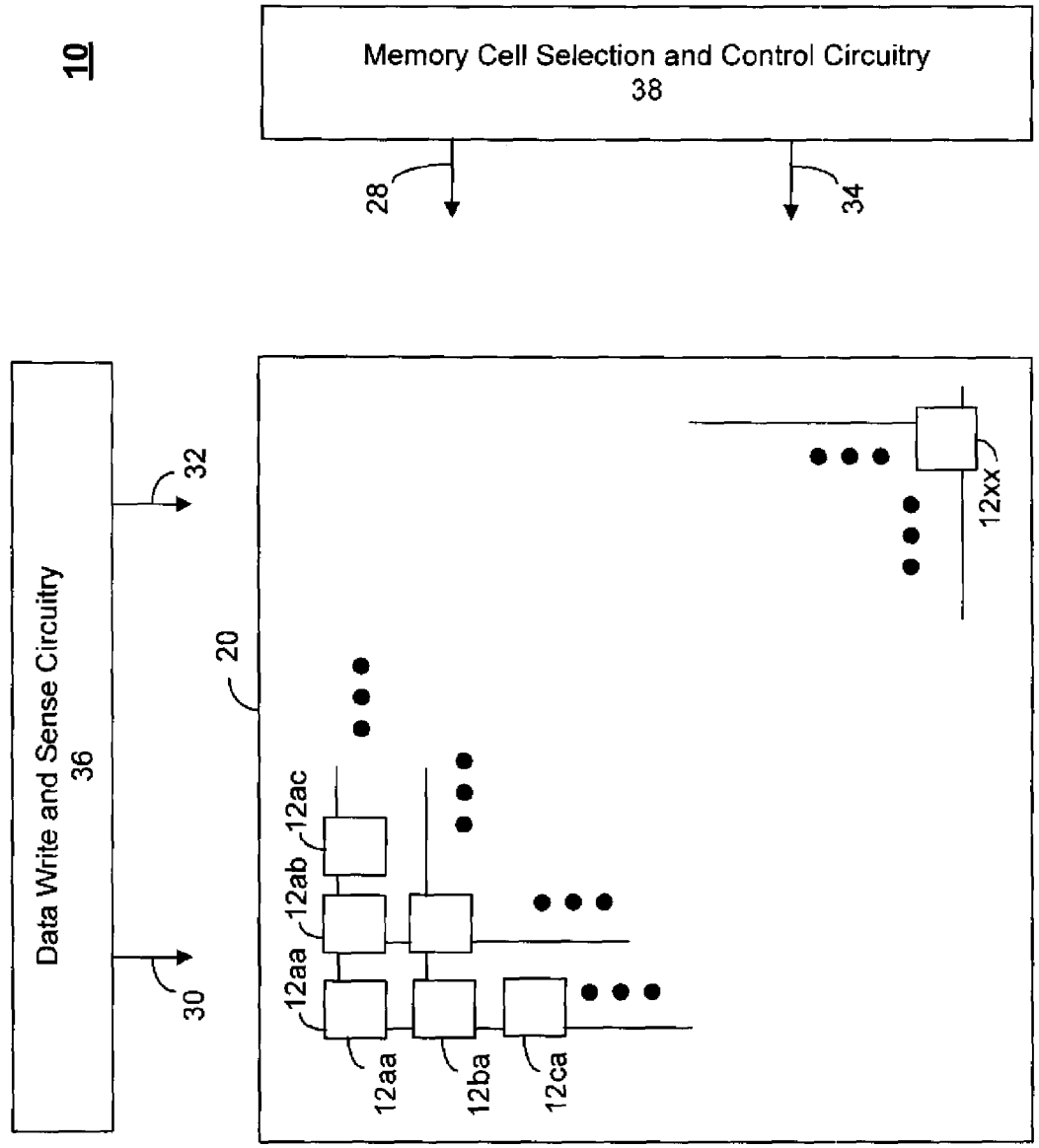
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28, and/or a carrier injection line (EP) 34, and the data write and sense circuitry 36 via a source line (CN) 30 and/or a bit line (EN) 32. It may be appreciated that the source line (CN) 30 and the bit line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (EN) 32 and a current or voltage reference signal. For example, each data sense amplifier may be a cross-coupled type sense amplifier to sense a data state stored in a memory cell 12. Also, each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (e.g., binary "1" data state) or a logic low (e.g., binary "0" data state). It may be appreciated by one having ordinary skill in the art that various types or forms of data write and sense circuitry 36 (including one or more sense amplifiers, using voltage or current sensing techniques, using or not reference cells, to sense a data state stored in a memory cell 12) may be employed to read data stored in memory cells 12 and/or write data to memory cells 12. The data write and sense circuitry 36 will be discussed further in detail below.

The memory cell selection and control circuitry 38 may select and/or enable one or more predetermined memory cells 12 to facilitate reading data therefrom and/or writing data thereto by applying control signals on one or more word lines (WL) 28, and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 36 may include one or more different control/selection techniques (and circuitry therefore) to select and/or enable one or more predetermined memory cells 12. Notably, all such control/selection techniques, and circuitry therefore, whether now known or later developed, are intended to fall within the scope of the present disclosure.

In an exemplary embodiment, the semiconductor memory device 10 may implement a two step write operation whereby all the memory cells 12 in a row of memory cells 12 may be first written to a first predetermined data state. For example, the memory cells 12 in an active row of the memory cell array 20 may be first written to a logic high (e.g., binary "1" data state) by executing a logic high (e.g., binary "1" data state) write operation. Thereafter, selected memory cells 12 in the active row of the memory cell array 20 may be selectively written to a second predetermined data state. For example, selected memory cells 12 in the active row of the memory cell array 20 may be selectively written to a logic low (e.g., binary "0" data state) by executing a logic low (e.g., binary "0" data state) write operation. The semiconductor memory device 10 may also implement a one step write operation whereby selected memory cells 12 in an active row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, refreshing, holding, and/or reading techniques described herein.

The memory cells 12 may comprise N-type, P-type and/or both types of transistors. Circuitry that is peripheral to the memory array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory array 20, suitable voltage potentials (for example, positive or negative voltage potentials) for reading from and/or writing to the memory cells 12 may be applied.

Figure 2:
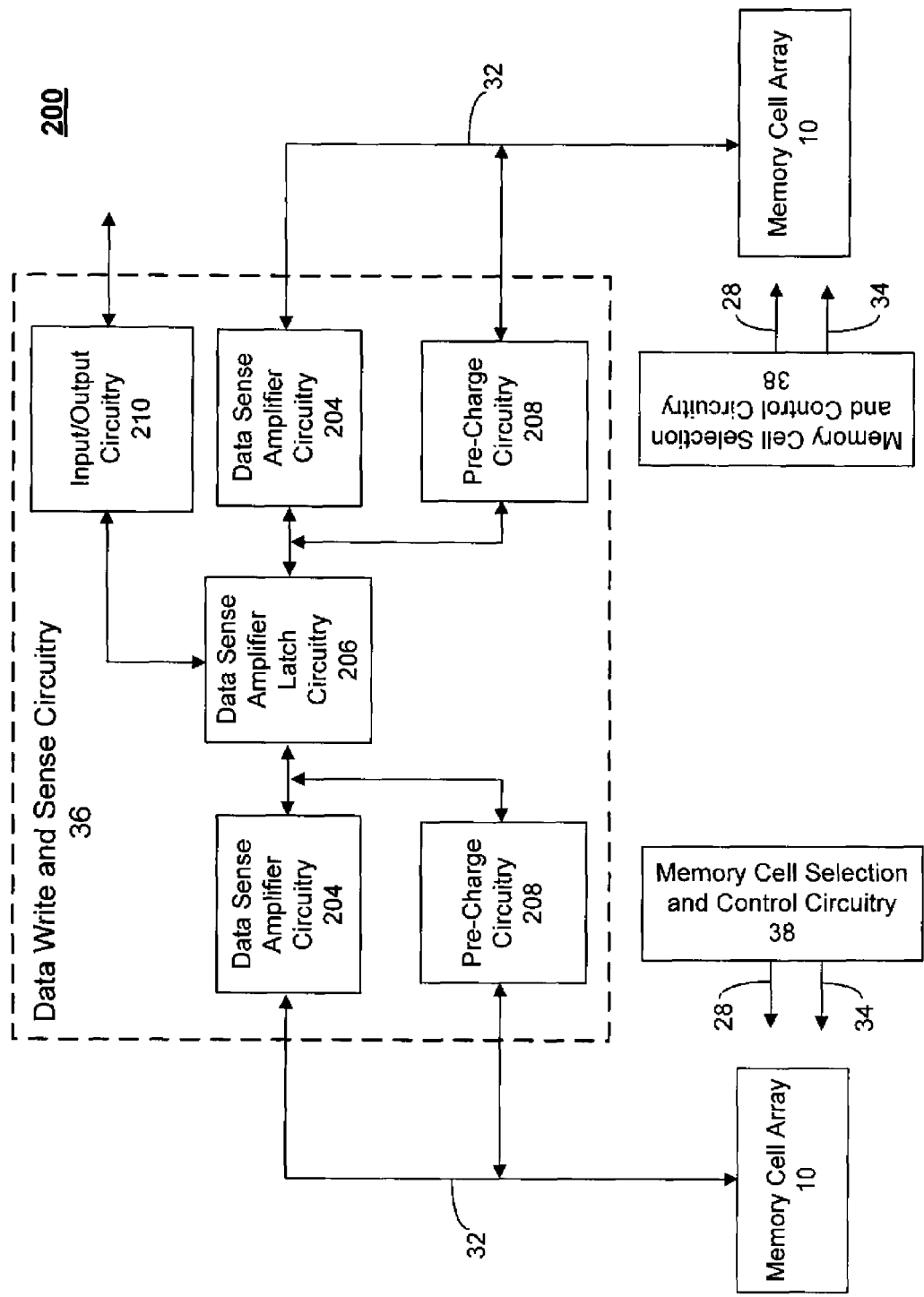
FIG. 2 shows a schematic block diagram of a portion of a semiconductor memory device in accordance with an embodiment of the present disclosure.

Referring to FIG. 2, there is shown a schematic block diagram of a portion of a semiconductor memory device 20 in accordance with an embodiment of the present disclosure. As discussed above, the semiconductor memory device 20 may include the memory cell selection and control circuitry 38 controllable and/or selectively coupled to one or more memory cell arrays 10 via one or more word lines (WL) 28 and/or carrier injection lines (EP) 34. The semiconductor memory device 20 may also include the data write and sense circuitry 36 controllable and/or selectively coupled to one or more memory cell arrays 10 via one or more bit lines (EN) 32 and/or source line (CN) 30 (not shown). In an exemplary embodiment, the data write and sense circuitry 36 may be coupled to a plurality of memory cell arrays 10 via a plurality of corresponding bit lines (EN) 32. The data write and sense circuitry 36 may include one or more data sense amplifier circuits 204 coupled to each memory cell array 10, data sense amplifier latch circuitry 206, one or more pre-charge circuits 208, and/or input/output circuitry 210.

The one or more data sense amplifier circuits 204 may sample, sense, read, and/or determine a data state (e.g., a logic low (binary "0" data state) or a logic high (binary "1" data state)) stored in a memory cell 12. The one or more data sense amplifier circuits 204 may sense raising phase of the current spikes and sinking phase of the current spikes on the bit line (EN) 32 in order to determine a data state stored in the memory cell 12. In an exemplary embodiment, the one or more data sense amplifier circuits 204 may include a PNP bipolar junction transistor to sense sourced current spikes on the bit line (EN) 32 in order to determine a data state stored in the memory cell 12. In another exemplary embodiment, the one or more data sense amplifier circuits 204 may include an NPN bipolar junction transistor to sense sunk current spikes on the bit line (EN) 32 in order to determine a data state stored in the memory cell 12.

For example, during a sample, sense, read, and/or data state determining operation, the data sense amplifier circuitry 204 may be pre-charged via the pre-charge circuitry 208. For example, the pre-charge circuitry 208 may pre-charge the data sense amplifier circuitry 204 to an equalization voltage potential or a reference voltage potential. The data sense amplifier circuitry 204 may compare a current generated by a memory cell 12 with an applied pre-charged reference current. In an exemplary embodiment, the pre-charged reference voltage and/or current applied to the data sense amplifier circuitry 204 may have a magnitude between a magnitude of voltage/current that may represent a logic low (binary "0" data state) and a magnitude of voltage/current that may represent a logic high (binary "1" data state) stored in the memory cell 12. In another exemplary embodiment, the pre-charged reference voltage and/or current applied to the data sense amplifier circuitry 204 may have a magnitude equal to the magnitude of the voltage/current that may represent a logic low (binary "0" data state) or a magnitude of voltage/current that may represent a logic high (binary "1" data state) stored in the memory cell 12.

The one or more data sense amplifier circuits 204 may output the data state of a memory cell 12 to the data sense amplifier latch circuitry 206 and stored. In another exemplary embodiment, the data sense amplifier latch circuitry 206 may be directly coupled to the bit line (EN) 32 associated with a memory cell 12. For example, the data sense amplifier latch circuitry 206 may receive a voltage potential or current on the bit line (EN) 32. The voltage potential or current received from the bit line (EN) 32 may be provided as a reference voltage potential and/or current for the data sense amplifier latch circuitry 206.

The data sense amplifier latch circuitry 206 may perform a write operation to the memory cell 12. For example, during a write operation, a data state may be loaded into the data sense amplifier latch circuitry 206 via the input/output circuitry 210. The data state may be written to the memory cell 12 via the data sense amplifier latch circuitry 206. Also for example, during a write-back operation, a data state stored in the data sense amplifier latch circuitry 206 may be written back to the memory cell 12 via the bit line (EN) 32.

The input/output circuitry 210 may allow external access to the plurality of memory cells 12 in the plurality of memory cell arrays 10 via the data sense amplifier latch circuitry 206. The input/output circuitry 210 may selectively and/or controllably output a data state stored in the memory cells 12 of the memory cell arrays 10. Also, the input/output circuitry 208 may selectively and/or controllably input (e.g., write or write-back) a data state to the memory cells 12 of the memory cell arrays 10. In an exemplary embodiment, the input/output circuitry 210 may include various gates and/or switch circuitry to facilitate and/or implement various operations on the memory cells 12 of the memory cell arrays 10.

The memory cell selection and control circuitry 38 may control one or more selected memory cells 12 of the memory cell arrays 10 coupled to the data write and sense circuitry 36. In an exemplary embodiment, the memory cell selection and control circuitry 38 may include a plurality of word lines (WL) 28, a plurality of carrier injection lines (EP) 34, word line (WL) decoders and/or drivers, and/or carrier injection line (EP) decoders and/or drivers. The memory cell selection and control circuitry 38 may apply one or more control signals via the plurality of word lines (WL) 28 and/or the plurality of carrier injection lines (EP) 34. Also, the memory cell selection and control circuitry 38 may include pass gates and/or row switch circuitry (not shown) to selectively activate the memory cells 12 in order to perform various operations.

Figure 3:
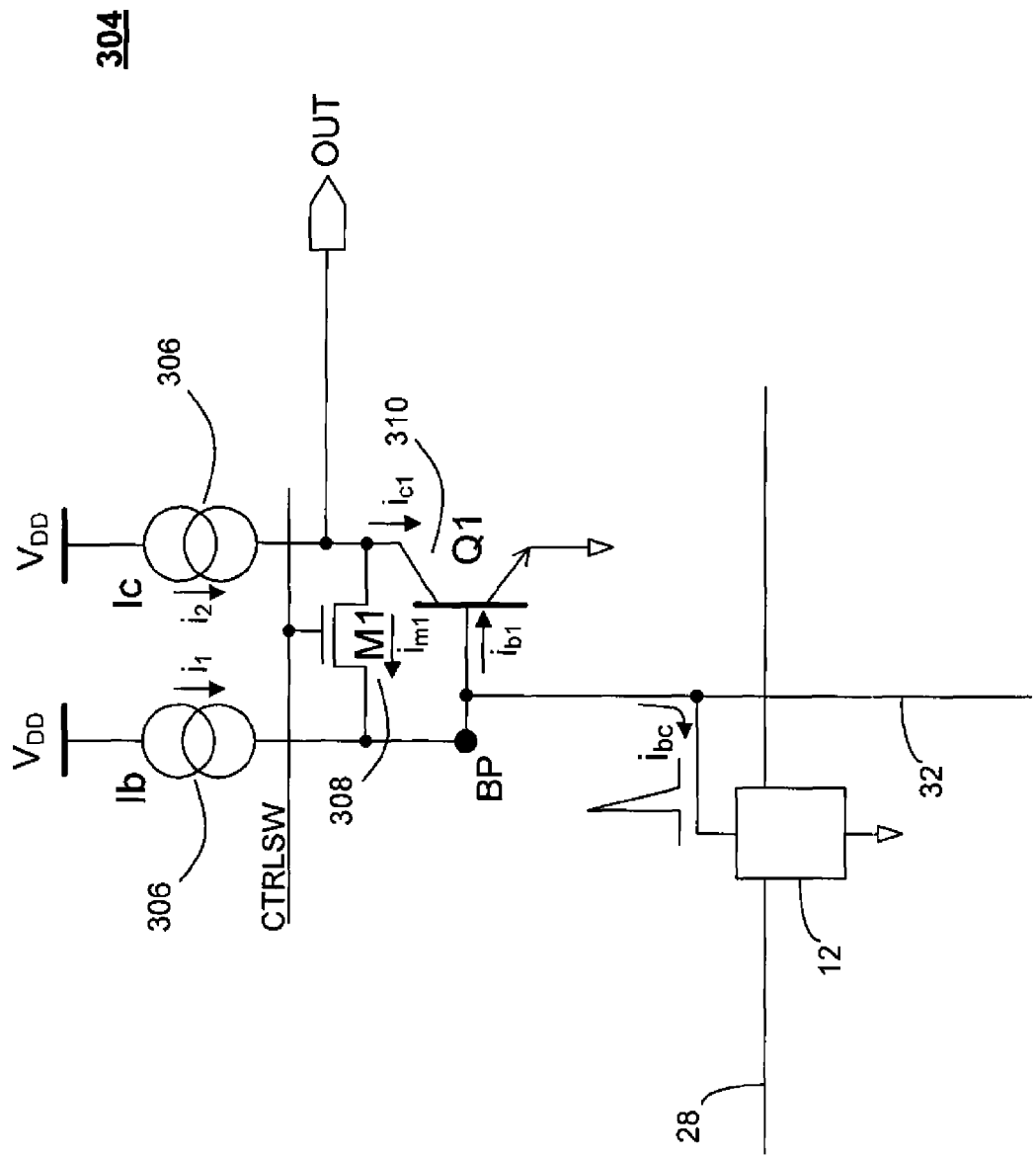
FIG. 3 shows a schematic diagram of data sense amplifier circuitry in accordance with an embodiment of the present disclosure.

Referring to FIG. 3, there is shown a schematic diagram of data sense amplifier circuitry 304 in accordance with an embodiment of the present disclosure. The data sense amplifier circuitry 304 may include one or more power source input circuits (Ib) and (Ic) 306, a switch transistor 308, and/or an amplifier transistor 310.

The one or more power source input circuits (Ib) and (Ic) 306 may be implemented as a voltage potential power source or a current power source. The one or more power source input circuits (Ib) and (Ic) 306 may include one or more transistors biased to supply the power to the data sense amplifier circuitry 304. In an exemplary embodiment, the one or more power source input circuits (Ib) and (Ic) 306 may include one or more metal-oxide semiconductor field-effect (MOSFET) transistors in order to supply power to the data sense amplifier circuitry 304.

The data sense amplifier circuitry 304 may include an input node (BP) coupled to bit line (EN) 32. In an exemplary embodiment, the input node (BP) may be set to and/or maintained at a voltage potential and/or current provided by a memory cell 12. The data sense amplifier circuitry 304 may include an output node (OUT) in order to output a data state detected by the data sense amplifier circuitry 304. The data sense amplifier circuitry 304 may include a switch control line (CTRLSW) coupled to the switch transistor 308 in order to control an operation of the switch transistor 308.

The data sense amplifier circuitry 304 may be pre-charged to a reference voltage and/or current before a sample, sense, read, and/or data state determining operation. Pre-charging the data sense amplifier circuitry 304 may ensure proper biasing for the amplifier transistor 310 of the data sense amplifier circuitry 304 and an active memory cell 12. In an exemplary embodiment, a control signal may be applied to the switch transistor 308 via the switch control line (CTRLSW). The control signal may cause the switch transistor 308 to turn to an "ON" state from an "OFF" state. The switch transistor 308, after being turned to an "ON" state, may couple a voltage potential on the bit line (EN) 32 to the output node (OUT) of the data sense amplifier circuitry 304. Also, switch transistor 308, after being turned to an "ON" state, may charge the bit line (EN) 32 to a predetermined voltage potential and/or current. For example, current ($I_1$) from the power source (Ib) 306 and current ($I_{M1}$) from the switch transistor 308 may charge the bit line (EN) 32 to a predetermined current and/or a predetermined voltage potential.

The data sense amplifier circuitry 304 may be pre-charged after reaching an equalization voltage potential or current. For example, the voltage potential on the bit line (EN) 32 may reach an PN junction threshold voltage potential of the amplifier transistor 310 and may cause the base current ($I_{B1}$) and the collector current ($I_{C1}$) of the amplifier transistor 310 to increase. The increase of the collector current ($I_{C1}$) of the amplifier transistor 310 may cause a decrease of the current ($I_{M1}$) from the switch transistor 308 (e.g., current ($I_{M1}$)=current ($I_2$) from power source (Ic) 306−collector current ($I_{C1}$) of the amplifier transistor 310). The decrease of the current from the switch transistor 308 may decrease the base current ($I_{B1}$) of the amplifier transistor 310 (e.g., the base current ($I_{B1}$) =current ($I_1$) from the power source (Ib) 306+the current ($I_{M1}$) from the switch transistor 308). The equalization voltage potential or current may be reached because of the feedback operation of the current ($I_{M1}$) from the switch transistor 308, the base current ($I_{B1}$) of the amplifier transistor 310, and the collector current ($I_{C1}$) of the amplifier transistor 310.

In an exemplary embodiment, the equalization voltage potential and current may be achieved at the end of the feedback operation of the current ($I_{M1}$) from the switch transistor 308, the base current ($I_{B1}$) of the amplifier transistor 310, and the collector current ($I_{C1}$) of the amplifier transistor 310. For example, the equalization voltage potential may be achieved when the voltage potential on the bit line (EN) 32 may equal to the output voltage potential (OUT) of the data sense amplifier circuitry 304 and the voltage potential ($V_{BE}$) at the base and emitter junction of the amplifier transistor 310. In an exemplary embodiment, the equalization voltage potential may be approximately 0.7V. Also, the equalization voltage potential and/or current may equal to the reference voltage potential and/or current that the data sense amplifier circuitry 304 may pre-charged to.

After pre-charging the data sense amplifier circuitry 304, the data sense amplifier circuitry 304 may be prepared to perform a sample, sense, read, and/or data state determining operation. The control signal applied to the switch control line (CTRLSW) may be withdrawn and the switch transistor 308 may be turned to an "OFF" state. A control signal may be applied to a memory cell 12 via a corresponding word line (WL) 28 to active the memory cell 12 in order to perform a data state determining operation. The data sense amplifier circuitry 304 may detect a current spike or an absence of a current spike on a bit line (EN) 32 corresponding to the active memory cell 12. For example, the current spike on the bit line (EN) 32 may modulate the base current ($I_{B1}$) of the amplifier transistor 310. The modulation of the base current ($I_{B1}$) of the amplifier transistor 310 may cause a change in the collector current ($I_{C1}$) of the amplifier transistor 310. The change in the collector current ($I_{C1}$) of the amplifier transistor 310 may cause a change in the output signal at the output node (OUT) to determine a data state stored in the active memory cell 12.

In an exemplary embodiment, in the event that a logic high (binary "1" data state) is stored in the memory cell 12, the control signal applied to the active memory cell 12 via the corresponding word line (WL) 28 may cause a current spike ($I_{BC}$) on the corresponding bit line (EN) 32. The sinking of the current spike ($I_{BC}$) on the corresponding bit line (EN) 32 may cause a decrease in the base current ($I_{B1}$) of the amplifier transistor 310 (e.g., the base current ($I_{B1}$) of the amplifier transistor 310=the current ($I_1$) from the power source (Ib) 306+the current ($I_{CAP}$) from the capacitance on the bit line (EN) 32−the current spike ($I_{BC}$) on the bit line (EN) 32). The decrease in the base current ($I_{B1}$) of the amplifier transistor 310 may cause a decrease in the collector current ($I_{C1}$) of the amplifier transistor 310. The decrease of the collector current ($I_{C1}$) of the amplifier transistor 310 may cause an increase in the voltage potential at the output node (OUT) of the data sense amplifier circuitry 304. The increase in the voltage potential at the output node (OUT) of the data sense amplifier circuitry 304 may indicate that a logic high (binary "1" data state) is stored in the active memory cell 12.

In another exemplary embodiment, in the event that a logic low (binary "0" data state) is stored in the memory cell 12, the control signal applied to the active memory cell 12 via the corresponding word line (WL) 28 may not cause a current spike ($I_{BC}$) on the corresponding bit line (EN) 32. The absence of a current spike ($I_{BC}$) on the corresponding bit line (EN) 32 may cause an increase in the base current ($I_{B1}$) of the amplifier transistor 310 (e.g., the base current ($I_{B1}$) of the amplifier transistor 310=the current ($I_1$) from the power source (Ib) 306+the current ($I_{CAP}$) from the capacitance of the bit line (EN) 32−the current spike ($I_{BC}$) on the bit line (EN) 32). The increase in the base current ($I_{B1}$) of the amplifier transistor 310 may cause an increase in the collector current ($I_{C1}$) of the amplifier transistor 310. The increase of the collector current ($I_{C1}$) of the amplifier transistor 310 may cause a decrease in the voltage potential at the output node (OUT) of the data sense amplifier circuitry 304. The decrease in the voltage potential at the output node (OUT) of the data sense amplifier circuitry 304 may indicate that a logic low (binary "0" data state) is stored in the active memory cell 12.

Figure 4:
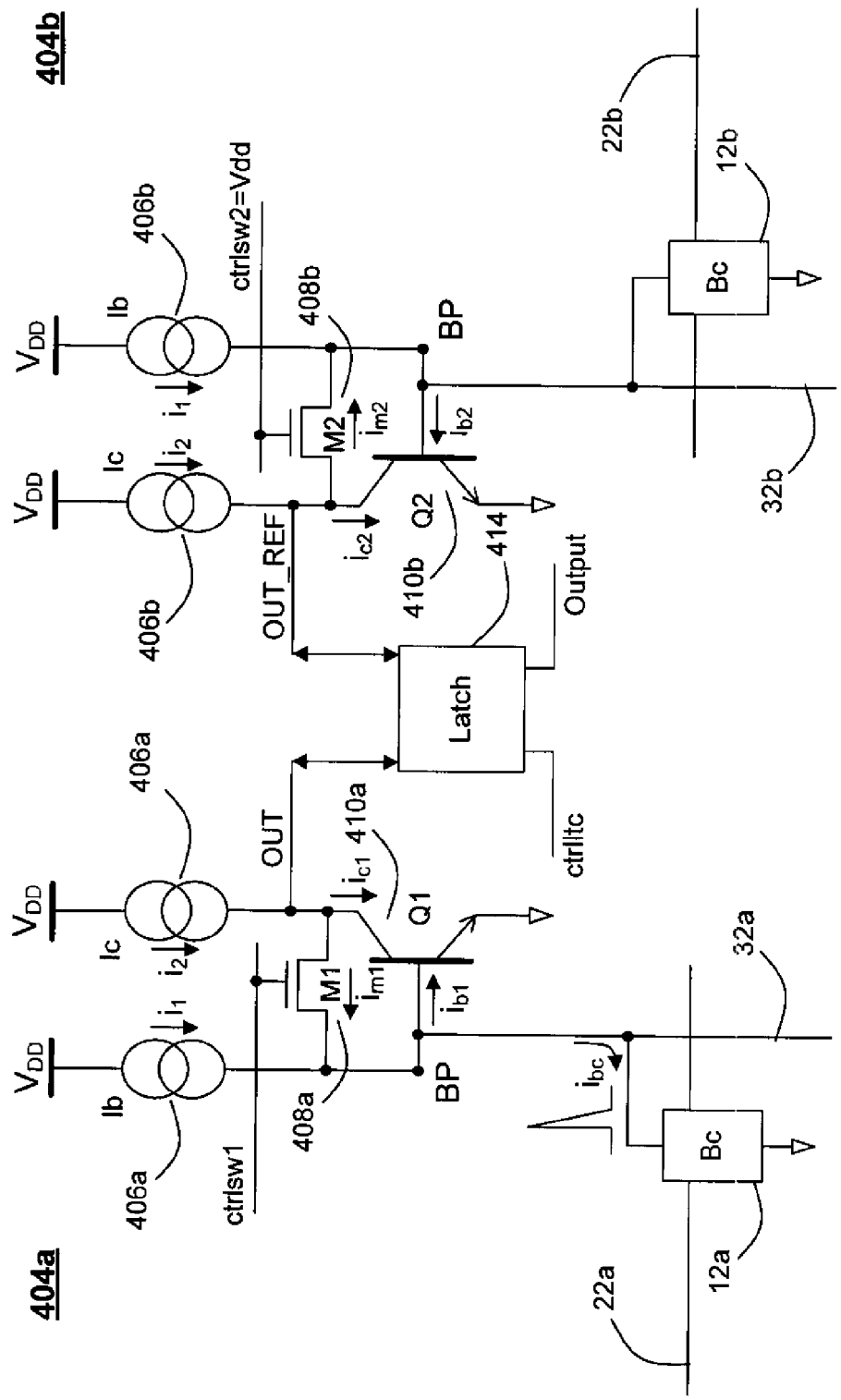
FIG. 4 shows a schematic diagram of a plurality of data sense amplifier circuits in accordance with an embodiment of the present disclosure.

Referring to FIG. 4, there is shown a schematic diagram of a plurality of data sense amplifier circuits 404 in accordance with an embodiment of the present disclosure. As discussed above, the data sense amplifier circuitry 404a may include one or more power source input circuits (Ib) and (Ic) 406a, a switch transistor 408a, and/or an amplifier transistor 410a. The data sense amplifier circuitry 404a may be coupled to an active memory cell 12a via a corresponding bit line (EN) 32a. The data sense amplifier circuitry 404b may include one or more power source input circuits (Ib) and (Ic) 406b, a switch transistor 408b, and/or an amplifier transistor 410b. The data sense amplifier circuitry 404b may be coupled to an inactive memory cell 12b via a corresponding bit line (EN) 32b. The data sense amplifier circuitry 404a and the data sense amplifier circuitry 404b may be coupled to data sense amplifier latch circuitry 414. In an exemplary embodiment, the data sense amplifier circuitry 404b may provide a matching load to the data sense amplifier circuitry 404a. In another exemplary embodiment, the data sense amplifier 404b may be a duplicate of the data sense amplifier circuitry 404a.

The data sense amplifier latch circuitry 414 may include an input node (OUT) coupled to the data sense amplifier circuitry 404a and an input node (OUT_REF) coupled to the data sense amplifier circuitry 404b. In an exemplary embodiment, the input node (OUT) of the data sense amplifier latch circuitry 414 may be set to and/or maintained at a voltage and/or current provided by the active memory cell 12a, while the input node (OUT_REF) may be set to and/or maintained at a reference voltage and/or current provided by the data sense amplifier circuitry 404b. In another exemplary embodiment, the input node (OUT_REF) may be set to and/or maintained at a voltage and/or current provided by the inactive memory cell 12, while the input node (OUT) may be set to and/or maintained at a reference voltage and/or current provided by the data sense amplifier circuitry 404a. The data sense amplifier latch circuitry 414 may store a data state determined by either the data sense amplifier circuitry 404a or the data sense amplifier circuitry 404b.

The voltage potential and/or current provided by the active memory cell 12a at the input node (OUT) and the reference voltage potential and/or current provided by the data sense amplifier circuitry 404b at the input node (OUT_REF) may produce a voltage potential and/or a current differential between the input node (OUT) and the input node (OUT_REF). In an exemplary embodiment, the data sense amplifier circuitry 404b may output the reference voltage potential and/or current to the data sense amplifier latch circuitry 414 via the input node (OUT_REF). For example, a control signal may be applied to the switch transistor 408b via the switch control line (CTRLSW2). The control signal applied to the switch control line (CTRLSW2) may be a constant voltage potential ($V_{DD}$) or a constant current and cause the output of the data sense amplifier circuitry 404b to be constant. The control signal applied via the control line (CTRLSW2) may cause the switch transistor 408b to turn to an "ON" state from an "OFF" state. The switch transistor 408b, after being turned to an "ON" state, may couple a voltage potential on the bit line (EN) 32b to the output node (OUT_REF) of the data sense amplifier circuitry 404b. Also, switch transistor 408b, after being turned to an "ON" state, may charge the bit line (EN) 32 to a predetermined voltage potential and/or current. For example, current ($I_1$) from the power source (Ib) 406b and current ($I_{M2}$) from the switch transistor 408b may charge the bit line (EN) 32 to a predetermined current.

The data sense amplifier circuitry 404b may reach an equalization voltage potential or current. For example, the voltage potential on the bit line (EN) 32b may reach an PN junction threshold voltage potential of the amplifier transistor 410b and may cause the base current ($I_{B2}$) and the collector current ($I_{C2}$) of the amplifier transistor 410b to increase. The increase of the collector current ($I_{C2}$) of the amplifier transistor 410b may cause a decrease of the current ($I_{M2}$) from the switch transistor 408b (e.g., current ($I_2$)=current ($I_2$) from power source (Ic) 406b−collector current ($I_{C2}$) of the amplifier transistor 410b). The decrease of the current from the switch transistor 408b may decrease the base current ($I_{B2}$) of the amplifier transistor 410b (e.g., the base current ($I_{B2}$)=current ($I_1$) from the power source (Ib) 406b+the current ($I_{M2}$) from the switch transistor 408b). The equalization voltage potential or current may be reached because of the feedback operation of the current ($I_{M2}$) from the switch transistor 408b, the base current ($I_{B2}$) of the amplifier transistor 410b, and the collector current ($I_{C2}$) of the amplifier transistor 410b.

In an exemplary embodiment, the equalization voltage potential and current may be achieved at the end of the feedback operation of the current ($I_{M2}$) from the switch transistor 408b, the base current ($I_{B2}$) of the amplifier transistor 410b, and the collector current ($I_{C2}$) of the amplifier transistor 410b. For example, the equalization voltage potential may be achieved when the voltage potential on the bit line (EN) 32b may equal to the output voltage potential at output node (OUT_REF) of the data sense amplifier circuitry 404b and the voltage potential ($V_{BE}$) at the base and emitter junction of the amplifier transistor 410b. In an exemplary embodiment, the equalization voltage potential may be approximately 0.7V. The output of the data sense amplifier circuitry 404b to the input node (OUT_REF) of the data sense amplifier latch circuitry 414 may be constant throughout the sample, sense, read, and/or data state determining operation. The output of the data sense amplifier circuitry 404b may provide a tracking mechanism for the output signals of the data sense amplifier circuitry 404a during a pre-charging phase of the sample, sense, read, and/or data state determining operation. The data sense amplifier circuitry 404a may be pre-charged in a similar manner as the data sense amplifier circuitry 304 described above with respect to FIG. 3.

After pre-charging the data sense amplifier circuitry 404a, the data sense amplifier circuitry 404a may determine a data state stored in the active memory cell 12a. As discussed above with respect to FIG. 3, the data sense amplifier circuitry 404a may cause the output signal at the output node (OUT) to decrease when a logic low (binary "0" data state) is stored in the active memory cell 12a. The data sense amplifier circuitry 404a may cause the output signal at the output node (OUT) to increase when a logic high (binary "1" data state) is stored in the active memory cell 12a. The variation in the output signal at the output node (OUT) may be a transient condition and the data sense amplifier latch circuitry 414 may be used to store a data state stored in the active memory cell 12a.

The data sense amplifier latch circuitry 414 may be enabled by applying a control signal to a control latch line (CTRLLTC). The data sense amplifier latch circuitry 414 may be configured to further amplify the variation of the input signals at the input node (OUT) supplied by the data sense amplifier circuitry 404a. In an exemplary embodiment, the data sense amplifier latch circuitry 414 may include a cross-coupled latch that provides a feedback loop for the input signals at the input node (OUT). The cross coupled latch of the data sense amplifier latch circuitry 414 may amplify the input signals at the input node (OUT) supplied by the data sense amplifier circuitry 404a. The data sense amplifier latch circuitry 414 may determine a data state of the active memory cell 12a based at least in part on the input signals at the input node (OUT) supplied by the data sense amplifier circuitry 404a.

For example, assuming that a logic high (binary "1" data state) is stored in the active memory cell 12a. When the data amplifier latch circuitry 414 senses low, the input node (OUT) may be pre-charged to a voltage potential of approximately 0V and the input node (OUT_REF) may be pre-charged to a voltage potential of approximately 100 mV. The logic high (binary "1" data state) stored in the active memory cell 12a may cause the voltage potential at the input node (OUT) to rise to approximately 200 mV. The data amplifier latch circuitry 414 may read a logic high (binary "1" data state) is stored in the active memory cell 12a.

In another exemplary embodiment, assuming that a logic low (binary "0" data state) is stored in the active memory cell 12a. When the data amplifier latch circuitry 414 senses high, the output node (OUT) may be pre-charged to a voltage potential of approximately $V_{DD}$ voltage potential and the input node (OUT_REF) may be pre-charged to a voltage potential of approximately half of the $V_{DD}$ voltage potential. By pre-charging the input node (OUT_REF) to midway of the $V_{DD}$ voltage potential may enable fast settling for the data sense amplifier latch circuitry 414. The logic low (binary "0" data state) stored in the memory cell 12 may not cause the voltage potential at the input node (OUT) to change and the voltage potential at the input node (OUT) may maintain at approximately $V_{DD}$ voltage potential. The data amplifier latch circuitry 414 may read a logic low (binary "0" data state) is stored in the active memory cell 12a. Also, the pre-charged voltage potential at the input node (OUT_REF) may change (e.g., rise or fall) to a voltage potential either higher than (e.g., when a logic high (binary "1" data state) is stored in the active memory cell 12a and the data sense amplifier latch circuitry 414 senses low) or below (e.g., when a logic high (binary "1" data state) is stored in the active memory cell 12a and the data sense amplifier latch circuitry 414 senses high) the pre-charged voltage potential at the input node (OUT_REF).

The pre-charged voltage potential at the input node (OUT_REF) may be selected based on when the data amplifier latch circuitry 414 senses high or low. For example, the pre-charged voltage potential at the input node (OUT_REF) may be selected to be lower than the pre-charged voltage potential at the input node (OUT) when the data sense amplifier latch circuitry 414 senses high. Also, the pre-charged voltage potential at the input node (OUT_REF) may be selected to be higher than the pre-charged voltage potential at the input node (OUT) when the data sense amplifier latch circuitry 414 senses low.

Figure 5:
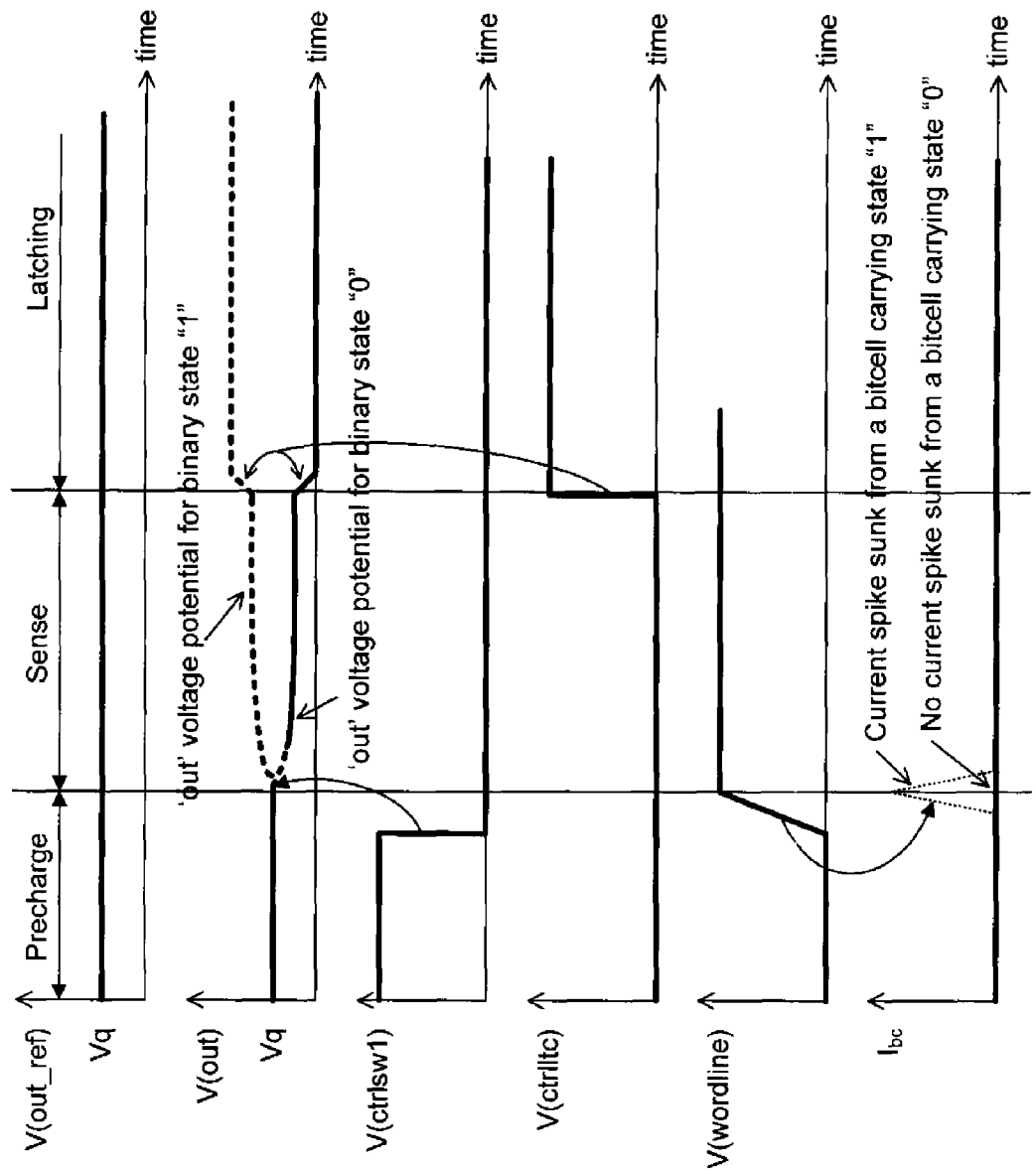
FIG. 5 shows control signal voltage waveforms for performing a sensing operation on one or more active memory cells in accordance with an embodiment of the present disclosure.

Referring to FIG. 5, there are shown control signal voltage waveforms for performing a sensing operation on one or more active memory cells 12a in accordance with an embodiment of the present disclosure. The sensing operation may include one or more phases. For example, the sensing operation may include a pre-charge phase, a sense phase, and/or a latching phase. In an exemplary embodiment, during the pre-charge phase a control signal may be applied to the switch control line (CTRLSW1) coupled to the switch transistor 408a in order to turn the switch transistor 408a to an "ON" state. As discussed above, after the switch transistor 408a is turned to an "ON" state, the data sense amplifier circuitry 404a may reach an equalization voltage potential and/or current. The data sense amplifier circuitry 404a may output the equalization voltage potential and/or current via the output node (OUT) to the data sense amplifier latch circuitry 414. Also, the data sense amplifier circuitry 404b may be biased to reach and maintain an equalization voltage potential and/or current throughout the various phases of the sensing operation. The data sense amplifier circuitry 404b may output the equalization voltage potential and/or current via the output node (OUT_REF) to the data sense amplifier latch circuitry 414.

After pre-charging the data sense amplifier circuitry 404a, the data sense amplifier circuitry 404b, and the data sense amplifier latch circuitry 414, a sense phase of the sensing operation may begin. For example, a control signal may be applied to the active memory cell via the word line (WL) 28a. The control signal applied via the word line (WL) 28a may cause a current spike ($I_{BC}$) on the bit line (EN) 32a when a logic high (binary "1" data state) is stored in the active memory cell 12a. The control signal applied via the word line (WL) 28a may not cause a current spike ($I_{BC}$) on the bit line (EN) 32a when a logic low (binary "1" data state) is stored in the active memory cell 12a. As explained above, the output signal at the output node (OUT) of the data sense amplifier circuitry 404a may vary depending on the data state stored in the active memory cell 12a. In an exemplary embodiment, the output signal at the output node (OUT) of the data sense amplifier circuitry 404a may increase when a logic high (binary "1" data state) is stored in the active memory cell 12a. In another exemplary embodiment, the output signal at the output node (OUT) of the data sense amplifier circuitry 404a may decrease when a logic low (binary "0" data state) is stored in the active memory cell 12a.

During latching phase of the sensing operation, a control signal may be applied to the data sense amplifier latch circuitry 414 via a control latch line (CTRLLTC). The control signal applied to the data sense amplifier latch circuitry 414 may amplify a variation in the output signal of the data sense amplifier circuitry 404a. In an exemplary embodiment, the data sense amplifier latch circuitry 414 may include a cross-coupled latch that may provide a feedback loop to amplify the variation in the output signal of the data sense amplifier circuitry 404a. The data sense amplifier latch circuitry 414 may determine a data state stored in the active memory cell 12a and store the data state.

Figure 6:
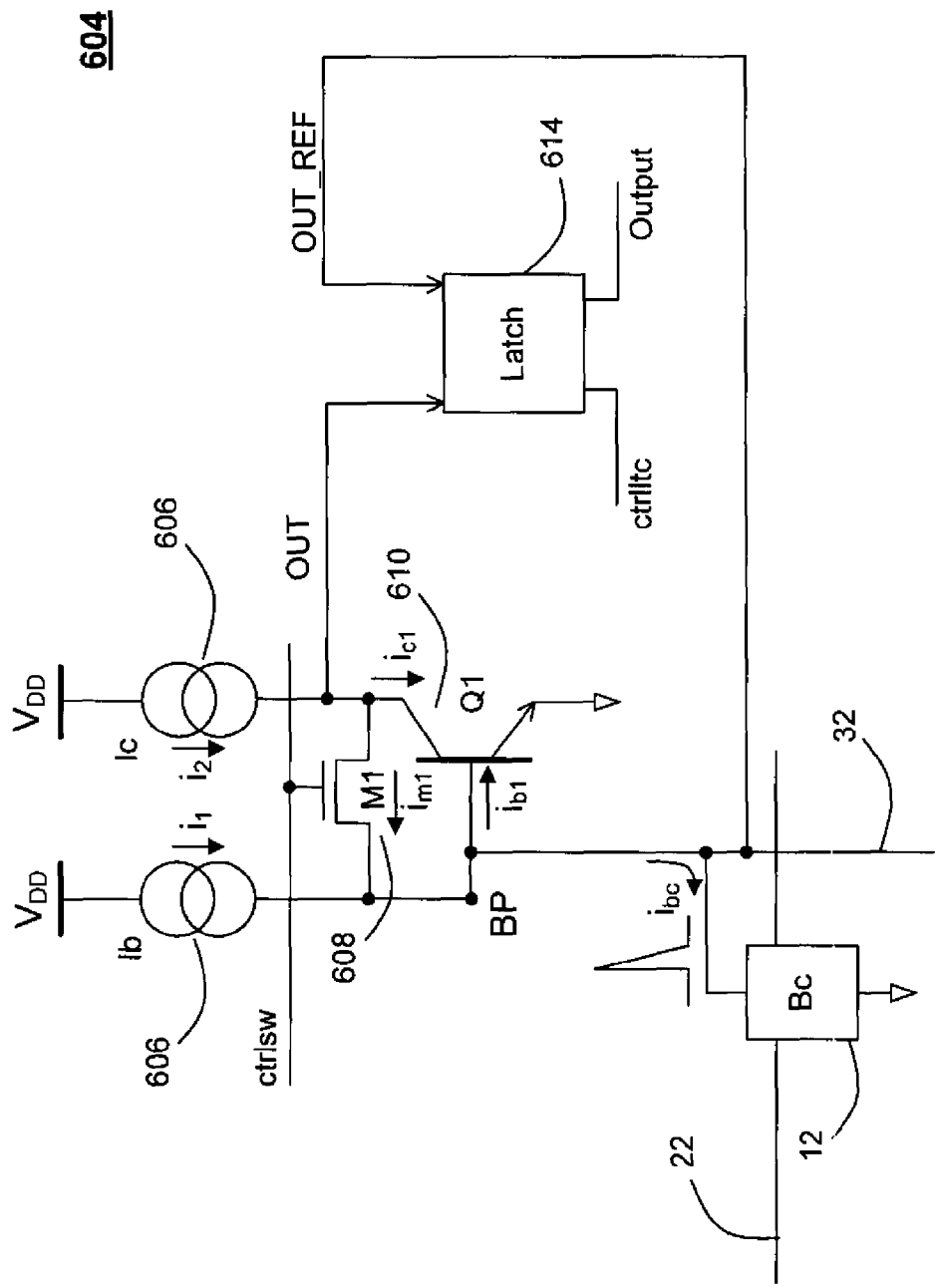
FIG. 6 shows a schematic diagram of data sense amplifier circuitry in accordance with another embodiment of the present disclosure.

Referring to FIG. 6, there is shown a schematic diagram of data sense amplifier circuitry 604 in accordance with another embodiment of the present disclosure. The data sense amplifier circuitry 604 may be implemented with the structure and techniques similar to that of the data sense amplifier circuitry 404 shown in FIG. 4, except that the input node (OUT_REF) of the data sense amplifier latch circuitry 614 may be coupled to the bit line (EN) 32. As illustrated in FIG. 6, the data sense amplifier circuitry 604 may include one or more power source input circuits (Ib) and (Ic) 606, a switch transistor 608, and/or an amplifier transistor 610.

By directly coupling the input node (OUT_REF) of the data sense amplifier latch circuitry 614 to the bit line (EN) 32, additional circuitry (e.g., data sense amplifier circuitry 404b shown in FIG. 4) may be eliminated. The amplifier transistor 610 may ensure that the required phase inversion to drive the input node (OUT) and input node (OUT_REF) of the data sense amplifier latch circuitry 414. For example, an increase in the voltage potential on the bit line (EN) 32 may cause the voltage potential at the input node (OUT_REF) of the data sense amplifier latch circuitry 414 to increase. However, the increase in the voltage potential on the bit line (EN) 32 may cause the voltage potential at the input node (OUT) of the data sense amplifier latch circuitry 414 to decrease (e.g., via the amplifier transistor 410). Thus, an increase of the voltage potential on the bit line (EN) 32 may cause a voltage potential differential between the input node (OUT) and the input node (OUT_REF) of the data sense amplifier latch circuitry 414. The voltage potential differential may be sufficient to enable the data sense amplifier latch circuitry 414 to determine a data state of the memory cell 12.

Figure 7:
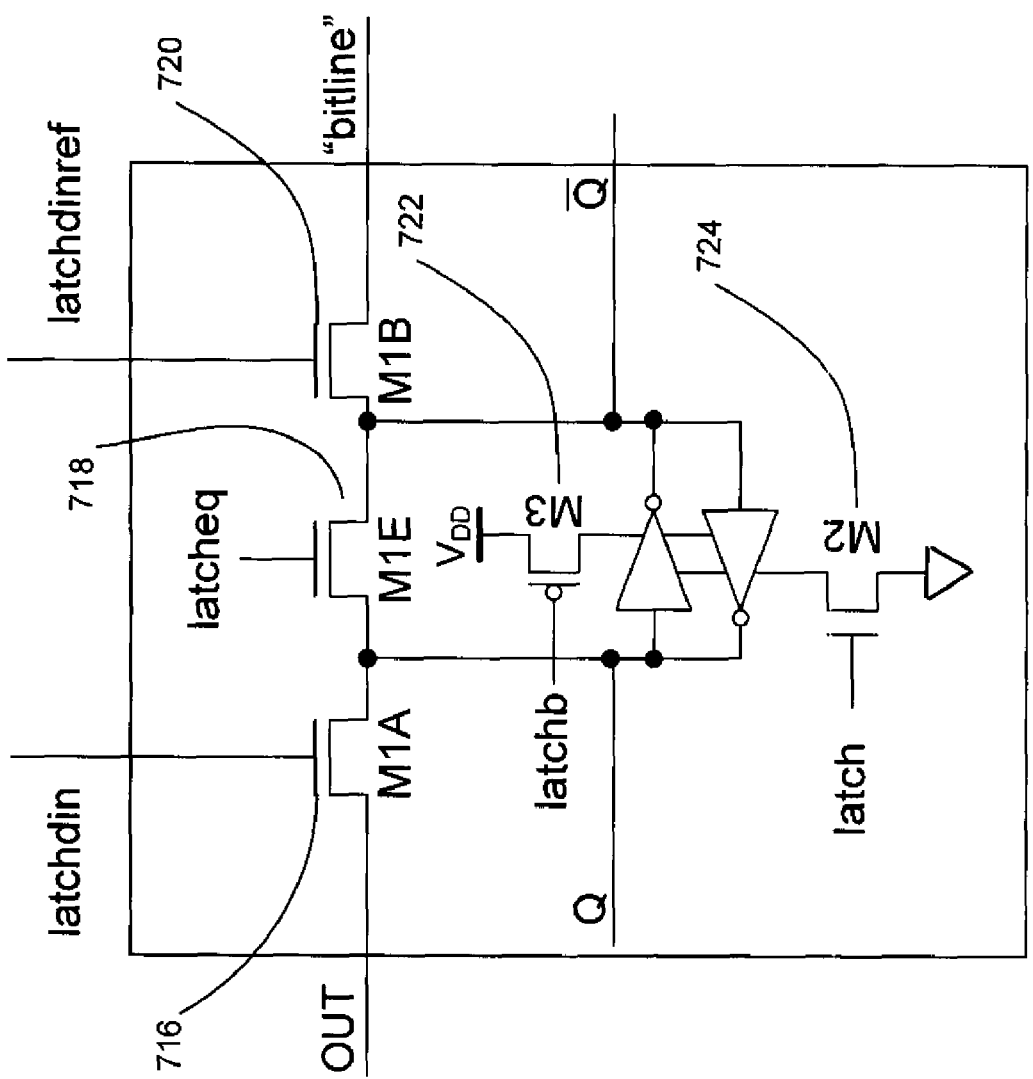
FIG. 7 shows a schematic diagram of data sense amplifier latch circuitry in accordance with an embodiment of the present disclosure.

Referring to FIG. 7, there is shown a schematic diagram of data sense amplifier latch circuitry 714 in accordance with an embodiment of the present disclosure. The data sense amplifier latch circuitry 714 may include a plurality of transistors (716-724) coupled to each other in order to store a data state stored in the memory cell 12. For example, the latch access transistor 716 may be coupled to the output node (OUT) of the data sense amplifier circuitry 404a, shown in FIG. 4. The latch access transistor 720 may be coupled to the output node (OUT_REF) of the data sense amplifier circuitry 404b, shown in FIG. 4. The equalization transistor 718 may ensure that the voltage potential at the output node (OUT) of the data sense amplifier circuitry 404a and the voltage potential at the output node (OUT_REF) of the data sense amplifier circuitry 404b may be the same before the sensing phase of the sensing operation. The latch access transistor 716 and 720 and the equalization transistor 718 may be biased to perform the function of the switch transistor 608, shown in FIG. 6.

The isolation transistors 722 and 724 may be configured to prevent the data sense amplifier latch circuitry 714 sinking currents when the data sense amplifier latch circuitry 714 is in an equalization phase. The data sense amplifier latch circuitry 714 may include a plurality of outputs (e.g., Q and inverse Q). The data state stored in the data sense amplifier latch circuitry 714 may be outputted to a memory input/output content (not shown). The data sense amplifier latch circuitry 714 may receive a data state from the memory input/output content (not shown).

Figure 8:
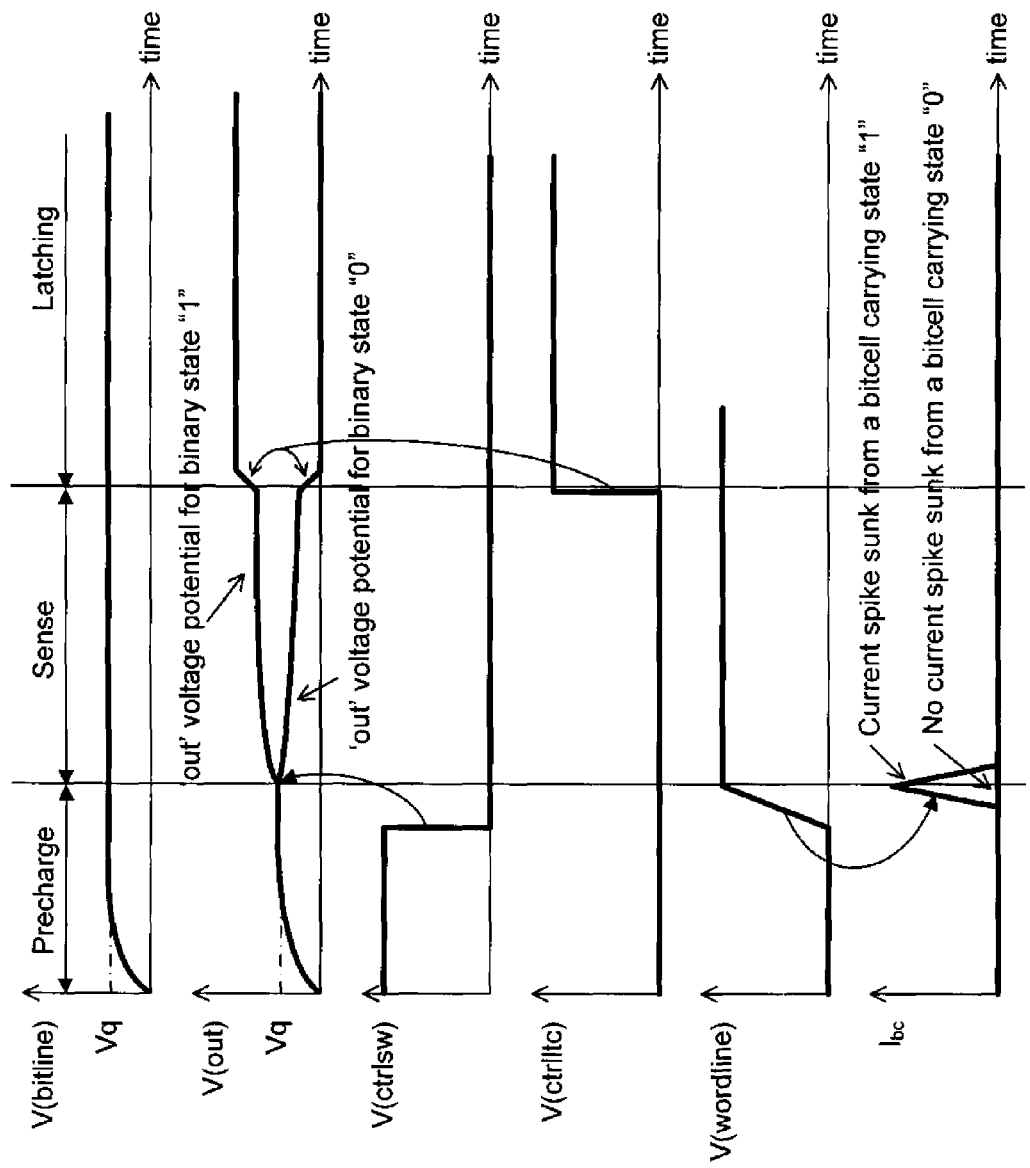
FIG. 8 shows control signal voltage waveforms for performing a sensing operation on one or more active memory cells in accordance with another embodiment of the present disclosure.

Referring to FIG. 8, there are shown control signal voltage waveforms for performing a sensing operation on one or more active memory cells 12a in accordance with another embodiment of the present disclosure. The sensing operation may include one or more phases. For example, the sensing operation may include a pre-charge phase, a sense phase, and a latching phase. In an exemplary embodiment, during the pre-charge phase a control signal may be applied to the switch control line (CTRLSW) coupled to the switch transistor 608 in order to turn the switch transistor 608 to an "ON" state. After the switch transistor 608 turned to an "ON" state, the data sense amplifier circuitry 604 may reach an equalization voltage potential and/or current, in a similar manner as discussed above with respect to the data sense amplifier circuitry 304, shown in FIG. 3. The data sense amplifier circuitry 604 may output the equalization voltage potential and/or current via the output node (OUT) to the data sense amplifier latch circuitry 614. The input node (OUT_REF) of the data sense amplifier latch circuitry 614 may be coupled to the bit line (EN) 32 in order to receive a reference voltage potential and/or current from the bit line (EN) 32. The voltage potential on the bit line (EN) 32 may remain constant throughout the sensing operation.

After pre-charging the data sense amplifier circuitry 604 and the data sense amplifier latch circuitry 614, a sense phase of the sensing operation may begin. For example, a control signal may be applied to the active memory cell 12 via the corresponding word line (WL) 28. The control signal applied via the corresponding word line (WL) 28 may cause a current spike ($I_{BC}$) on the bit line (EN) 32 when a logic high (binary "1" data state) is stored in the active memory cell 12. The control signal applied via the corresponding word line (WL) 28 may not cause a current spike ($I_{BC}$) on the bit line (EN) 32 when a logic low (binary "1" data state) is stored in the active memory cell 12. The output signal at the output node (OUT) of the data sense amplifier circuitry 604 may vary depending on the data state stored in the active memory cell 12. In an exemplary embodiment, the output signal at the output node (OUT) of the data sense amplifier circuitry 604 may increase when a logic high (binary "1" data state) is stored in the active memory cell 12. In another exemplary embodiment, the output signal at the output node (OUT) of the data sense amplifier circuitry 604 may decrease when a logic low (binary "0" data state) is stored in the active memory cell 12a.

During latching phase of the sensing operation, a control signal may be applied to the data sense amplifier latch circuitry 614 via a control latch line (CTRLLTC). The control signal applied to the data sense amplifier latch circuitry 614 may amplify a variation in the output signal of the data sense amplifier circuitry 604. In an exemplary embodiment, the data sense amplifier latch circuitry 614 may include a cross-coupled latch that may provide a feedback loop to amplify the variation in the output signal of the data sense amplifier circuitry 604. The data sense amplifier latch circuitry 614 may determine a data state stored in the active memory cell 12 and store the data state.

Figure 9:
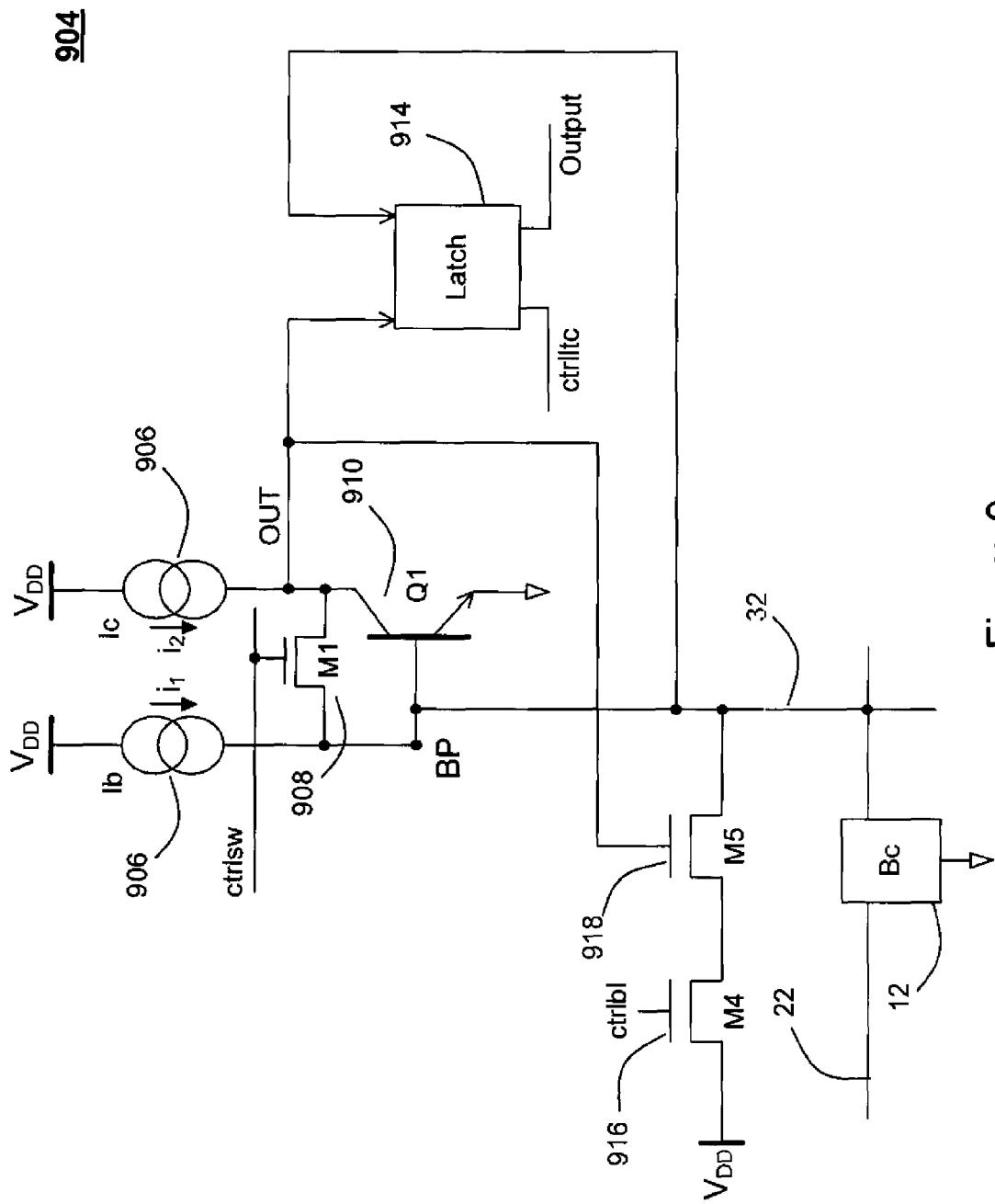
FIG. 9 shows a schematic diagram of data sense amplifier circuitry in accordance with another embodiment of the present disclosure.

Referring to FIG. 9, there is shown a schematic diagram of data sense amplifier circuitry 904 in accordance with another embodiment of the present disclosure. The data sense amplifier circuitry 904 may be implemented with the structure and techniques similar to that of the data sense amplifier circuitry 604 shown in FIG. 6, except that a transistor 916 may be coupled to the bit line (EN) 32 via a transistor 918. As illustrated in FIG. 9, the data sense amplifier circuitry 904 may include one or more power source input circuits (Ib) and (Ic) 906, a switch transistor 908, and/or an amplifier transistor 910. The output node (OUT) of the data sense amplifier circuitry 904 may be coupled to a data sense amplifier latch circuitry 914. The input node (OUT_REF) of the data sense amplifier latch circuitry 914 may be directly coupled to the bit line (EN) 32.

The transistor 916 and the transistor 918 may be configured to efficiently pre-charge the bit line (EN) 32 to a predetermined voltage potential and/or current. For example, the transistor 916 may be controlled via a control signal applied to the control line (CTRLBL). The transistor 918 may be controlled via the output signal at the output node (OUT) of the data sense amplifier circuitry 904 to ensure a self shut-off action, as will be discussed further in detail below.

For example, during a pre-charge phase of a sensing operation, a control signal may be applied to the transistor 916 via the control line (CTRLBL). The control signal applied on the control line (CTRLBL) may turn the transistor 916 to an "ON" state. Also during a pre-charge phase of a sensing operation, the amplifier transistor 910 may be in an "OFF" state because the bit line (EN) 32 is grounded. When the amplifier transistor 910 is in an "OFF" state, the voltage potential at the output node (OUT) of the data sense amplifier circuitry 904 may be charged to a voltage potential approximately equal to a constant voltage potential ($V_{DD}$). The voltage potential at the output node of the data sense amplifier circuitry 904 may maximizing the conductance of the transistor 918 and may accelerate the pre-charging time of the bit line (EN) 32. As the bit line (EN) 32 becomes pre-charged, the voltage potential at the output node (OUT) of the data sense amplifier circuitry 904 may decrease and cause a decrease of the conductance of the transistor 918. The decrease of the conductance of the transistor 918 may self-limiting the pre-charge of the bit line (EN) 32. The control signal applied to the transistor 916 via the control line (CTRLBL) may be removed to de-activate the pre-charge path of the transistor 916 and the transistor 918.

When a control signal is applied to the switch transistor 908 via the switch control line (CTRLSW) during the pre-charge phase, the voltage potential on the bit line (EN) 32 may increase. The increase of the voltage potential on the bit line (EN) 32 may cause the amplifier transistor 910 to turn to an "ON" state from an "OFF" state. When the amplifier transistor 910 is turned to an "ON" state, the collector current ($I_{C1}$) of the amplifier transistor 910 may increase. The increase in the collector current ($I_{C1}$) of the amplifier transistor 910 may decrease the voltage potential at the output node (OUT) of the data sense amplifier circuitry 904. The decrease of the voltage potential at the output node (OUT) of the data sense amplifier circuitry 904 may decrease the conductance (e.g., an amount of current flowing through) of the transistor 918. The decrease of the conductance (e.g., an amount of current flowing through) of the transistor 918 may prevent over-charging the bit line (EN) 32 (e.g., too much current on the bit line (EN) 32) and thus avoid voltage fluctuation in the data sense amplifier circuitry 904 during the pre-charge phase of a sensing operation.

Figure 10:
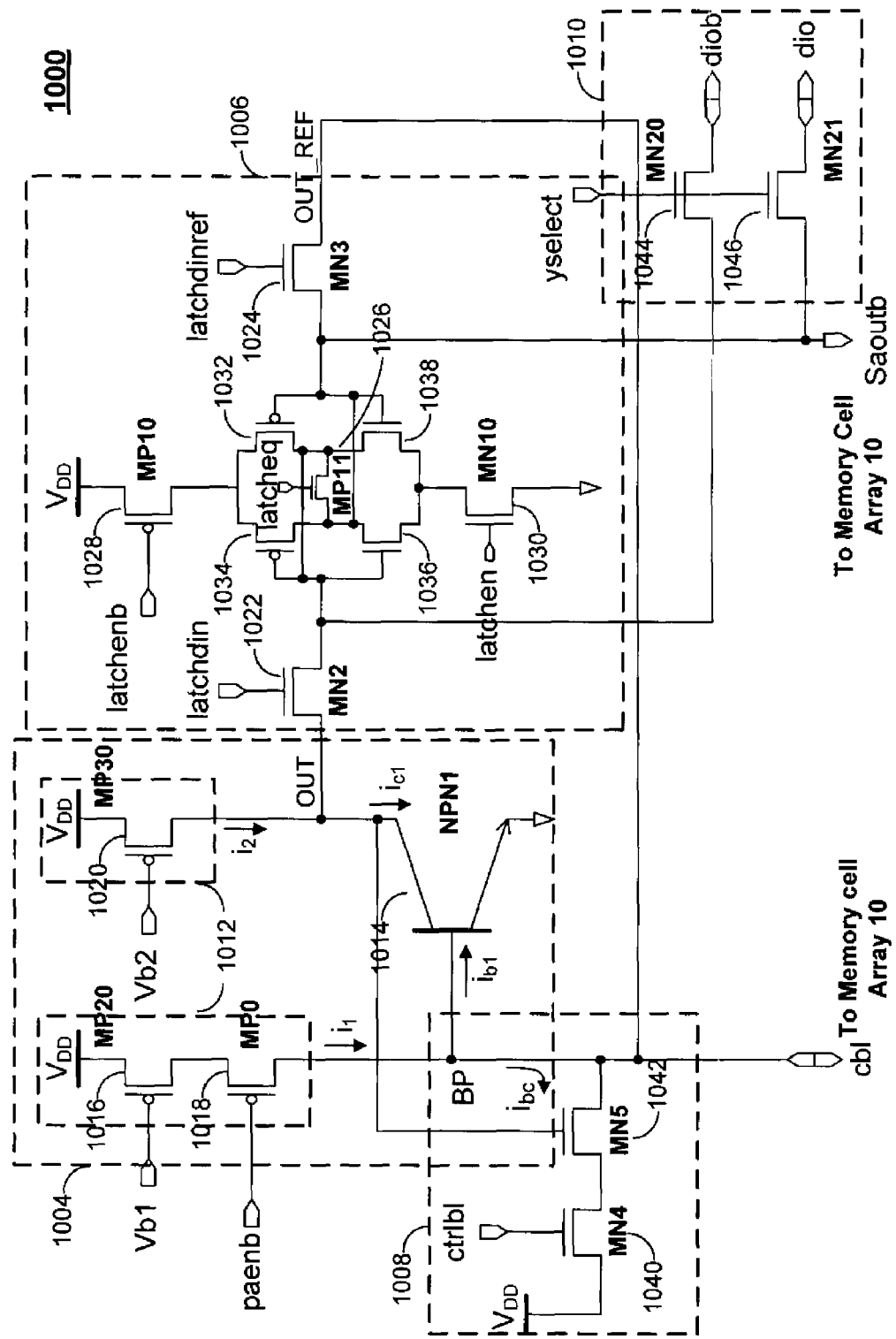
FIG. 10 shows a schematic block diagram of a portion of a semiconductor memory device in accordance with an embodiment of the present disclosure.

Referring to FIG. 10, there is shown a schematic block diagram of a portion of a semiconductor memory device 1000 in accordance with an embodiment of the present disclosure. The semiconductor memory device 1000 may include one or more memory cell arrays 10 coupled to data sense amplifier circuitry 1004, data sense amplifier latch circuitry 1006, pre-charge circuitry 1008, and/or input/output circuitry 1010.

The data sense amplifier circuitry 1004 may include one or more power sources 1012 and/or an amplifier transistor 1014. The one or more power sources 1012 may include one or more transistors (1016-1020) to supply voltage potential and/or or current to the data sense amplifier circuitry 1004.

The data sense amplifier latch circuitry 1006 may include a plurality of transistors (1022-1038) coupled to each other in order to store a data state read from the memory cell 12. For example, the latch access transistor 1022 may be coupled to the output node (OUT) of the data sense amplifier circuitry 1004. The latch access transistor 1024 at the input node (OUT_REF) of the data sense amplifier latch circuitry 1006 may be coupled to the bit line (EN) 32. The equalization transistor 1026 may ensure that the voltage potential at the input node (OUT) of the data sense amplifier latch circuitry 1006 and the voltage potential at the input node (OUT_REF) of the data sense amplifier latch circuitry 1006 may be the same before the sensing phase of the sensing operation. The plurality of transistors (1032-1038) may be arranged in a cross-coupled configuration that may amplify the voltage potential difference and/or current difference between the input node (OUT) and the input node (OUT_REF) of the data sense amplifier latch circuitry 1006.

The pre-charge circuitry 1008 may include a transistor 1040 and a transistor 1042 configured to efficiently pre-charge the data sense amplifier circuitry 1004. For example, the transistor 1040 may be controlled via a control signal applied on the control line (CTRLBL). The transistor 918 may be controlled via the output signal at the output node (OUT) of the data sense amplifier circuitry 1004 to ensure a self shut-off action.

The input/output circuitry 1010 may include a transistor 1044 and a transistor 1046 may couple the data state stored in the data sense amplifier latch circuitry 1006. The transistor 1044 and the transistor 1046 may provide data state to the data sense amplifier latch circuitry 1006 to write to the memory cell 12.

The semiconductor memory device 1000 may perform various operations. For example, the semiconductor memory device 1000 may perform a holding operation, a read operation, a write operation, and/or a write-back operation. During a holding operation, a control signal may be applied to the transistor 1018 of the power source 1012 via the control line (PAENB) to turn the transistor 1018 to an "ON" state. A control signal may be applied to the transistor 1028 of the data sense amplifier latch circuitry 1006 via the control line (LATCHENB) to turn the transistor 1028 to an "ON" state. A control signal may be applied to the latch access transistor 1022 via the control line (LATCHDIN) to turn the latch access transistor 1022 to an "OFF" state. A control signal may be applied to the latch access transistor 1024 via the control line (LATCHDINREF) to turn the latch access transistor 1024 to an "OFF" state. A control signal may be applied to the transistor 1030 via the control line (LATCHEN) to turn the transistor 1030 to an "OFF" state. A control signal may be applied to the transistor 1040 via the control line (CTRLBL) to turn the transistor 1040 to an "OFF" state.

The semiconductor memory device 1000 may perform a sensing operation. The sensing operation may include various phases. The various phases of the sensing operation may include a pre-charge phase, an equalization phase, a sense phase, and a latching phase. During the pre-charging phase of a sensing operation, a control signal may be applied to the latch access transistor 1024 via the control line (LATCHDINREF) to turn the latch access transistor 1024 to an "ON" state. Also, a control signal may be applied to the equalization transistor 1026 via the control line (LATCHEQ) to turn the equalization transistor 1026 to an "ON" state. By turning the latch access transistor 1024 and the equalization transistor 1026 to an "ON" state, the input node (OUT_REF) of the data sense amplifier latch circuitry 1006 may be directly coupled to voltage potential on the bit line (EN) 32. Also, by turning the latch access transistor 1022, the latch access transistor 1024, and the equalization transistor 1026 to an "ON" state, the latch access transistor 1022, the latch access transistor 1024, and the equalization transistor 102 may perform the same electrical function as the switch transistor 904, shown in FIG. 9.

During the pre-charge phase of the sensing operation, a control signal is applied to the transistor 1040 via the control line (CTRLBL) to turn the transistor 104 to an "ON" state in order to pre-charge the bit line (EN) 32. By pre-charging the bit line (EN) 32, the voltage potential on the bit line (EN) 32 may increase. The increase of the voltage potential on the bit line (EN) 32 may cause the amplifier transistor 1014 to turn to an "ON" state from an "OFF" state. When the amplifier transistor 1014 is turned to an "ON" state, the collector current ($I_{C1}$) of the amplifier transistor 1014 may increase. The increase in the collector current ($I_{C1}$) of the amplifier transistor 910 may decrease the voltage potential at the output node (OUT) of the data sense amplifier circuitry 1004. The decrease of the voltage potential at the output node (OUT) of the data sense amplifier circuitry 1004 may decrease the conductance (e.g., an amount of current flowing through) of the transistor 1042. The decrease of the conductance (e.g., an amount of current flowing through) of the transistor 1042 may prevent over-charging the bit line (EN) 32 and thus avoid voltage fluctuation in the data sense amplifier circuitry 1004 during the pre-charge phase of a sensing operation. After pre-charging the bit line (EN) 32, the control signal applied to the transistor 1040 via the control line (CTRLBL) may be removed and the transistor 1040 may turn to an "OFF" state.

During the equalization phase of a sensing operation, a control signal may be applied to the latch access transistor 1022 via the control line (LATCHDIN) to turn the latch access transistor 1022 to an "ON" state. By turning the latch access transistor 1022 to an "ON" state, the output signal at the output node (OUT) of the data sense amplifier circuitry 1004 may be inputted to the data sense amplifier latch circuitry 1006. For example, the output signal at the output node (OUT) of the data sense amplifier circuitry 1004 may be an equalization voltage potential and/or current of the data sense amplifier circuitry 1004. In an exemplary embodiment, the equalization voltage potential at the output node (OUT) of the data sense amplifier circuitry 1004 may be equal to 0.7V. At the end of the equalization phase, a control signal applied to the equalization transistor 1026 via the control line (LATCHEQ) may be removed and the equalization transistor 1026 may turn to an "OFF" state.

During the sense phase of a sensing operation, a control signal may be applied to a memory cell 12 via a corresponding word line (WL) 28 to active the memory cell 12 in order to sense a data state stored in the memory cell 12. The data sense amplifier circuitry 1004 may detect a current spike or an absence of a current spike on a bit line (EN) 32 corresponding to the active memory cell 12. For example, the current spike on the bit line (EN) 32 may modulate the base current ($I_{B1}$) of the amplifier transistor 1014. The modulation of the base current ($I_{B1}$) of the amplifier transistor 310 may cause a change in the collector current ($I_{C1}$) of the amplifier transistor 1014. The change in the collector current ($I_{C1}$) of the amplifier transistor 1014 may cause a change in the output signal at the output node (OUT) to determine a data state stored in the active memory cell 12.

In an exemplary embodiment, in the event that a logic high (binary "1" data state) is stored in the memory cell 12, the control signal applied to the active memory cell 12 via the corresponding word line (WL) 28 may cause a current spike ($I_{BC}$) on the corresponding bit line (EN) 32. The sinking of the current spike ($I_{BC}$) on the corresponding bit line (EN) 32 may cause a decrease in the base current ($I_{B1}$) of the amplifier transistor 1014 (e.g., the base current ($I_{B1}$) of the amplifier transistor 1014=the current ($I_1$) from the power source 1012+ the current ($I_{CAP}$) from the capacitance of bit line (EN) 32–the current spike ($I_{BC}$) on the bit line (EN) 32). The decrease in the base current ($I_{B1}$) of the amplifier transistor 1014 may cause a decrease in the collector current ($I_{C1}$) of the amplifier transistor 1014. The decrease of the collector current ($I_{C1}$) of the amplifier transistor 1014 may cause an increase in the voltage potential at the output node (OUT) of the data sense amplifier circuitry 1004. The increase in the voltage potential at the output node (OUT) of the data sense amplifier circuitry 1004 may indicate that a logic high (binary "1" data state) is stored in the active memory cell 12.

In another exemplary embodiment, in the event that a logic low (binary "0" data state) is stored in the memory cell 12, the control signal applied to the active memory cell 12 via the corresponding word line (WL) 28 may not cause a current spike ($I_{BC}$) on the corresponding bit line (EN) 32. The absence of the sinking of a current spike ($I_{BC}$) on the corresponding bit line (EN) 32 may cause an increase in the base current ($I_{B1}$) of the amplifier transistor 1014 (e.g., the base current ($I_{B1}$) of the amplifier transistor 1014=the current ($I_1$) from the power source 1012+the current ($I_{CAP}$) from the capacitance of bit line (EN) 32–the current spike ($I_{BC}$) on the bit line (EN) 32). The increase in the base current ($I_{B1}$) of the amplifier transistor 1014 may cause an increase in the collector current ($I_{C1}$) of the amplifier transistor 1014. The increase of the collector current ($I_{C1}$) of the amplifier transistor 1014 may cause a decrease in the voltage potential at the output node (OUT) of the data sense amplifier circuitry 1004. The decrease in the voltage potential at the output node (OUT) of the data sense amplifier circuitry 1004 may indicate that a logic low (binary "0" data state) is stored in the active memory cell 12.

During the latching phase of a sensing operation, the data sense amplifier latching circuitry 1006 may receive the output signal from the data sense amplifier circuitry 1004 via the input node (OUT). After receiving the output signal from the data sense amplifier circuitry 1004, a control signal may be applied to the latch access transistor 1022 via the control line (LATCHDIN) to turn the latch access transistor 1022 to an "OFF" state from an "ON" state. A control signal may be applied to the latch access transistor 1024 via the control line (LATCHDINREF) to turn the latch access transistor 1024 to an "OFF" state from an "ON" state. By turning the latch access transistors 1022 and 1024 to an "OFF" state, the data sense amplifier latch circuitry 1006 may not receive additional input signals. A control signal may be applied to the transistor 1028 via the control line (LATENB) to turn the transistor 1028 to an "ON" state. A control signal may be applied to the transistor 1030 via the control line (LATCHEN) to turn the transistor 1030 to an "ON" state. By turning the transistors 1028 and 1030 to an "ON" state, the data state may be stored in the data sense amplifier latch circuitry 1006.

The semiconductor memory device 1000 may perform a write operation. A data state to be written to the memory cell array 10 may be inputted to the data sense amplifier latch circuitry 1006 via the input/output circuitry 1010. For example, during the writing operation, the control line (CBL) may be disconnected from the memory cell array 10 and the data state may be written to the memory cell array 10 via the control line (SAOUTB). The write operation may include various phases. For example, the various phases of the write operation may include a loading phase and/or a write phase.

During a loading phase of a write operation, a data state to be written to the memory cell array 10 may be inputted to the data sense amplifier latch circuitry 1006 via the transistors 1044 and 1046 of the input/output circuitry 1010. For example, input node (DIOB) of the transistor 1044 and the input node (DIO) of the transistor 1046 may be coupled to memory input/output content (not shown). A control signal may be applied to the transistors 1044 and 1046 via the control line (YSELECT) to couple input data state from the memory input/output content to the data sense amplifier latch circuitry 1006. The data state to be written to the memory cell array 10 may be loaded into the data sense amplifier latch circuitry 1006.

In an exemplary embodiment, in the event that a logic high (binary "1" data state) is to be written to the memory cell array 10, a control signal may be applied to the control line (SAOUTB) to cause the voltage potential on the bit line (EN) 32 to go low in order to forward bias the memory cell array 10 to receive and store the injected charges. In another exemplary embodiment, in the event that a logic low (binary "0" data state) is to be written to the memory cell array 10, a control signal may be applied to the control line (SAOUTB) to cause the voltage potential on the bit line (EN) 32 to go high in order to reverse bias the memory cell array 10 to reject the charges.

The semiconductor memory device 1000 may perform a write-back operation. The write-back operation may be performed in a similar manner as discussed above with respect to the write operation, except the data state to be written back to the memory cell array 10 is already loaded into the data sense amplifier latch circuitry 1006.

Figure 11:
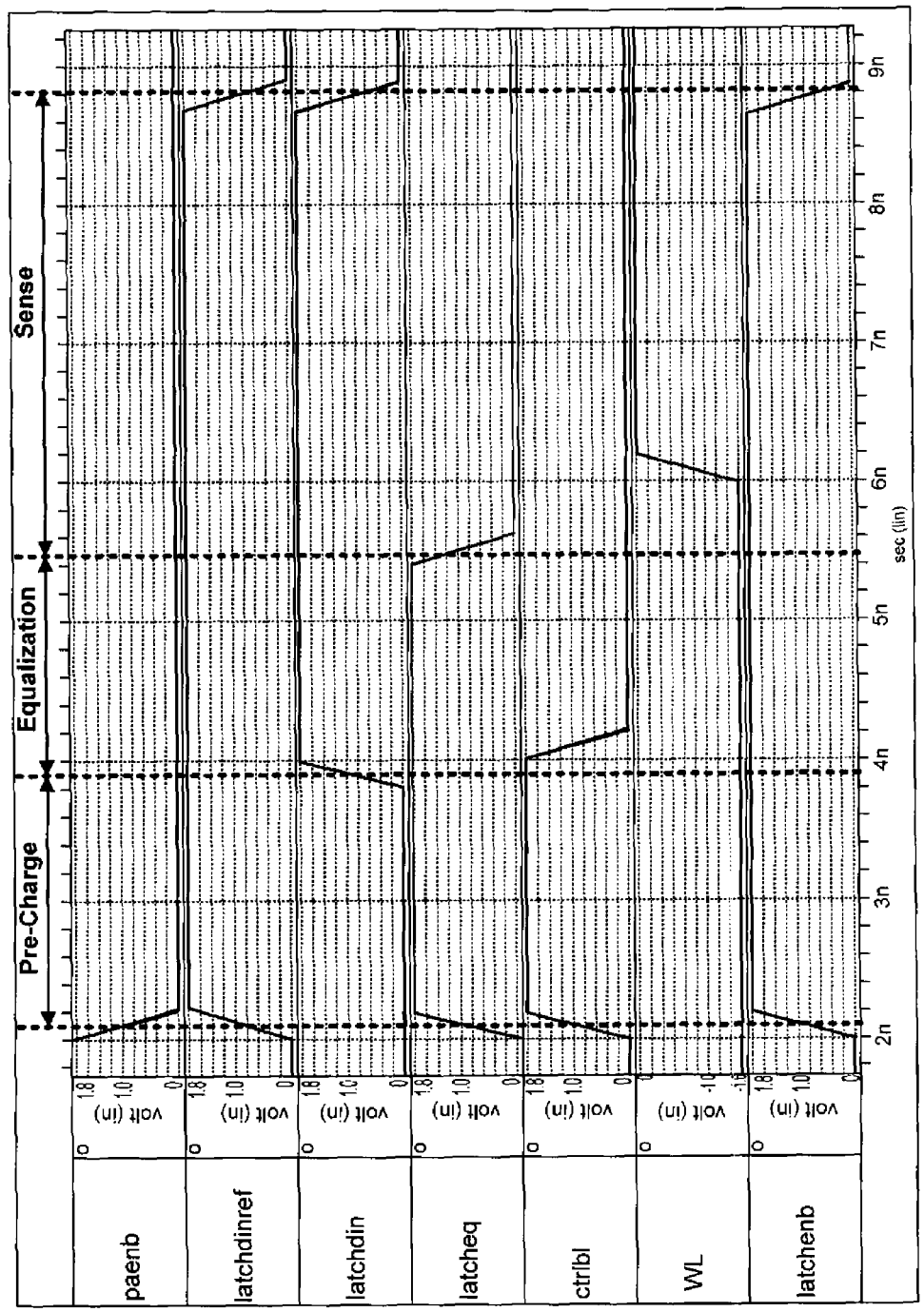
FIG. 11 shows control signal voltage waveforms for performing a read operation on a memory cell in accordance with an embodiment of the present disclosure.

Referring to FIG. 11, there is shown control signal voltage waveforms for performing a read operation on a memory cell in accordance with an embodiment of the present disclosure. The sensing operation may include various phases. The various phases of the sensing operation may include a pre-charge phase, an equalization phase, and/or a sense phase. During the pre-charging phase of a sensing operation, a control signal may be applied to the latch access transistor 1024 via the control line (LATCHDINREF) to turn the latch access transistor 1024 to an "ON" state. Also, a control signal may be applied to the equalization transistor 1026 via the control line (LATCHEQ) to turn the equalization transistor 1026 to an "ON" state. By turning the latch access transistor 1024 and the equalization transistor 1026 to an "ON" state, the input node (OUT_REF) of the data sense amplifier latch circuitry 1006 may be directly coupled to voltage potential on the bit line (EN) 32. A control signal may be applied to the transistor 1028 via the control line (LATENB) to turn the transistor 1028 to an "OFF" state. A control signal may be applied to transistor 1018 via the control line (PANEB) to turn the transistor 1018 to an "ON" state.

During the pre-charge phase of the sensing operation, a control signal is applied to the transistor 1040 via the control line (CTRLBL) to turn the transistor 104 to an "ON" state in order to pre-charge the bit line (EN) 32. By pre-charging the bit line (EN) 32, the voltage potential on the bit line (EN) 32 may increase. The increase of the voltage potential on the bit line (EN) 32 may cause the amplifier transistor 1014 to turn to an "ON" state from an "OFF" state. When the amplifier transistor 1014 is turned to an "ON" state, the collector current ($I_{C1}$) of the amplifier transistor 1014 may increase. The increase in the collector current ($I_{C1}$) of the amplifier transistor 910 may decrease the voltage potential at the output node (OUT) of the data sense amplifier circuitry 1004. The decrease of the voltage potential at the output node (OUT) of the data sense amplifier circuitry 1004 may decrease the conductance (e.g., an amount of current flowing through) of the transistor 1042. The decrease of the conductance (e.g., an amount of current flowing through) of the transistor 1042 may prevent over-charging the bit line (EN) 32 and thus avoid voltage fluctuation in the data sense amplifier circuitry 1004 during the pre-charge phase of a sensing operation. After pre-charging the bit line (EN) 32, the control signal applied to the transistor 1040 via the control line (CTRLBL) may be removed and the transistor 1040 may turn to an "OFF" state.

During the equalization phase of a sensing operation, a control signal may be applied to the latch access transistor 1022 via the control line (LATCHDIN) to turn the latch access transistor 1022 to an "ON" state. By turning the latch access transistor 1022 to an "ON" state, the output signal at the output node (OUT) of the data sense amplifier circuitry 1004 may be inputted to the data sense amplifier latch circuitry 1006. For example, the output signal at the output node (OUT) of the data sense amplifier circuitry 1004 may be an equalization voltage potential and/or current of the data sense amplifier circuitry 1004. In an exemplary embodiment, the equalization voltage potential at the output node (OUT) of the data sense amplifier circuitry 1004 may be equal to 0.7V. At the end of the equalization phase, a control signal applied to the equalization transistor 1026 via the control line (LATCHEQ) may be removed and the equalization transistor 1026 may turn to an "OFF" state.

During the sense phase of a sensing operation, a control signal may be applied to a memory cell 12 via a corresponding word line (WL) 28 to active the memory cell 12 in order to sense a data state stored in the memory cell 12. The data sense amplifier circuitry 1004 may detect a current spike or an absence of a current spike on a bit line (EN) 32 corresponding to the active memory cell 12. For example, the current spike on the bit line (EN) 32 may modulate the base current ($I_{B1}$) of the amplifier transistor 1014. The modulation of the base current ($I_{B1}$) of the amplifier transistor 310 may cause a change in the collector current ($I_{C1}$) of the amplifier transistor 1014. The change in the collector current ($I_{C1}$) of the amplifier transistor 1014 may cause a change in the output signal at the output node (OUT) to determine a data state stored in the active memory cell 12.

In an exemplary embodiment, in the event that a logic high (binary "1" data state) is stored in the memory cell 12, the control signal applied to the active memory cell 12 via the corresponding word line (WL) 28 may cause a current spike ($I_{BC}$) on the corresponding bit line (EN) 32. The sinking of the current spike ($I_{BC}$) on the corresponding bit line (EN) 32 may cause a decrease in the base current ($I_{B1}$) of the amplifier transistor 1014 (e.g., the base current ($I_{B1}$) of the amplifier transistor 1014=the current ($I_1$) from the power source 1012+ the current ($I_{CAP}$) from the capacitance of bit line (EN) 32−the current spike ($I_{BC}$) on the bit line (EN) 32). The decrease in the base current ($I_{B1}$) of the amplifier transistor 1014 may cause a decrease in the collector current ($I_{C1}$) of the amplifier transistor 1014. The decrease of the collector current ($I_{C1}$) of the amplifier transistor 1014 may cause an increase in the voltage potential at the output node (OUT) of the data sense amplifier circuitry 1004. The increase in the voltage potential at the output node (OUT) of the data sense amplifier circuitry 1004 may indicate that a logic high (binary "1" data state) is stored in the active memory cell 12.

In another exemplary embodiment, in the event that a logic low (binary "0" data state) is stored in the memory cell 12, the control signal applied to the active memory cell 12 via the corresponding word line (WL) 28 may not cause a current spike ($I_{BC}$) on the corresponding bit line (EN) 32. The absence of the sinking of a current spike ($I_{BC}$) on the corresponding bit line (EN) 32 may cause an increase in the base current ($I_{B1}$) of the amplifier transistor 1014 (e.g., the base current ($I_{B1}$) of the amplifier transistor 1014=the current ($I_1$) from the power source 1012+the current ($I_{CAP}$) from the capacitance of bit line (EN) 32–the current spike ($I_{BC}$) on the bit line (EN) 32). The increase in the base current ($I_{B1}$) of the amplifier transistor 1014 may cause an increase in the collector current ($I_{C1}$) of the amplifier transistor 1014. The increase of the collector current ($I_{C1}$) of the amplifier transistor 1014 may cause a decrease in the voltage potential at the output node (OUT) of the data sense amplifier circuitry 1004. The decrease in the voltage potential at the output node (OUT) of the data sense amplifier circuitry 1004 may indicate that a logic low (binary "0" data state) is stored in the active memory well 12.

At this point it should be noted that providing a technique for sensing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with sensing a semiconductor memory device in accordance with the present disclosure as described above. Alternatively, one or more processors operating in accordance with instructions may implement the functions associated with sensing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus comprising:
a memory cell array comprising a plurality of memory cells;
first data sense amplifier circuitry comprising an amplifier transistor having a first region coupled to at least one of the plurality of memory cells via a bit line; and
data sense amplifier latch circuitry comprising a first input node coupled to the first data sense amplifier circuitry via a second region of the amplifier transistor; wherein the data sense amplifier latch circuitry stores a data state determined by the first data sense amplifier circuitry.

2. The apparatus according to claim 1, further comprising a first power source coupled to the first region of the amplifier transistor.

3. The apparatus according to claim 1, further comprising a second power source coupled to the second region of the amplifier transistor.

4. The apparatus according to claim 1, further comprising a switch transistor coupled to the first region of amplifier transistor and the second region of the amplifier transistor.

5. The apparatus according to claim 4, wherein the switch transistor comprises a first region coupled to a first power source and a second region coupled to a second power source.

6. The apparatus according to claim 1, wherein the data sense amplifier latch circuitry comprises a second input node coupled to second data sense amplifier circuitry.

7. The apparatus according to claim 6, wherein the data sense amplifier latch circuitry further comprises a plurality of transistors arranged in a cross-coupled configuration that are configured to amplify a voltage or current difference between the first input node and the second input node.

8. The apparatus according to claim 6, wherein the second data sense amplifier circuitry provides a reference voltage potential to the second input node of the data sense amplifier latch circuitry.

9. The apparatus according to claim 1, wherein the data sense amplifier latch circuitry comprises a first latch access transistor at the first input node and a second latch access transistor at the second input node.

10. The apparatus according to claim 9, wherein the data sense amplifier latch circuitry comprises an equalization transistor arranged in series with the first latch access transistor and the second latch access transistor.

11. The apparatus according to claim 1, further comprising pre-charge circuitry coupled to the bit line.

12. The apparatus according to claim 11, wherein the pre-charge circuitry comprises a first pre-charge transistor coupled to a control line.

13. The apparatus according to claim 12, wherein the pre-charge circuitry further comprises a second pre-charge transistor having a first region coupled to the bit line.

14. The apparatus according to claim 13, wherein the second pre-charge transistor comprises a second region coupled to the first pre-charge transistor.

15. The apparatus according to claim 14, wherein the second pre-charge transistor further comprises a third region coupled to the second region of the amplifier transistor.

16. The apparatus according to claim 1, further comprising input/output circuitry coupled to the data sense amplifier latch circuitry.

17. The apparatus according to claim 16, wherein the input/output circuitry comprises a first input/output transistor coupled to the first input node of the data sense amplifier latch circuitry.

18. The apparatus according to claim 17, wherein the input/output circuitry further comprises a second input/output transistor coupled to a second input node of the data sense amplifier latch circuitry.

19. The apparatus according to claim 1, wherein the data sense amplifier latch circuitry comprises a second input node coupled to the bit line.

20. The apparatus according to claim 19, wherein a voltage potential at the first input node of the data sense amplifier latch circuitry is inversely related to a voltage potential at the second input node of the data sense amplifier latch circuitry.

* * * * *